(12) United States Patent
Shiratake

(10) Patent No.: US 7,674,673 B2
(45) Date of Patent: Mar. 9, 2010

(54) SEMICONDUCTOR DEVICE AND MANUFACTURING METHOD THEREOF

(75) Inventor: Shigeru Shiratake, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 12/018,864

(22) Filed: Jan. 24, 2008

(65) Prior Publication Data

US 2008/0124862 A1     May 29, 2008

Related U.S. Application Data

(62) Division of application No. 10/961,210, filed on Oct. 12, 2004, now Pat. No. 7,339,221.

(30) Foreign Application Priority Data

Oct. 14, 2003    (JP) ............................. 2003-353599

(51) Int. Cl.
*H01L 27/148* (2006.01)
*H01L 29/768* (2006.01)

(52) U.S. Cl. ..................... 438/239; 438/3; 438/241; 257/295

(58) Field of Classification Search ............... 438/3, 438/238–239, 241; 257/295–296, E21.417, 257/E21.42, E29.256, E29.261
See application file for complete search history.

(56) References Cited

U.S. PATENT DOCUMENTS 6,586,794 B2    7/2003    Nakamura et al.

| 6,967,365 | B2* | 11/2005 | Summerfelt et al. | 257/295 |
|---|---|---|---|---|
| 7,141,471 | B2* | 11/2006 | Yamada et al. | 438/239 |
| 2004/0188745 | A1* | 9/2004 | Kim et al. | 257/306 |

FOREIGN PATENT DOCUMENTS

| JP | 08-078641 | 3/1996 |
|---|---|---|
| JP | 10-326876 | 12/1998 |
| JP | 2000-353793 | 12/2000 |
| JP | 2001-057413 | 2/2001 |
| JP | 2001-185701 | 7/2001 |

OTHER PUBLICATIONS

Japanese Notice of Grounds of Rejection, w/ English translation thereof, issued in Japanese Patent Application No. JP 2003-353599 dated Feb. 17, 2009.

* cited by examiner

*Primary Examiner*—Theresa T Doan
(74) *Attorney, Agent, or Firm*—McDermott Will & Emery LLP

(57) ABSTRACT

A semiconductor device includes a silicon substrate having an active region, a memory transistor having a pair of source/drain regions and a gate electrode layer, a hard mask layer on the gate electrode layer having a plane pattern shape identical with that of the gate electrode layer, and plug conductive layers each electrically connected to each of the pair of source/drain regions. An extending direction of the active region is not perpendicular to that of the gate electrode layer, but is oblique. Upper surfaces of the hard mask layer and each of the plug conductive layers form substantially an identical plane. This can attain a semiconductor device allowing significant enlargement of a margin in a photolithographic process, suppression of an "aperture defect" as well as ensuring of a process tolerance of a "short" by decreasing a microloading effect, and decrease in a contact resistance, and a manufacturing method thereof.

3 Claims, 26 Drawing Sheets

SEMICONDUCTOR DEVICE AND MANUFACTURING METHOD THEREOF

RELATED APPLICATIONS

This application is a Divisional of U.S. application Ser. No. 10/961,210, filed Oct. 12, 2004, now U.S. Pat. No. 7,339,221, claiming priority of Japanese Application No. 2003-353599, filed Oct. 14, 2003, the entire contents of each of which are hereby incorporated by reference.

BACKGROUND OF THE INVENTION

1. Field of the Invention

The present invention relates to a semiconductor device and a manufacturing method thereof. More specifically, the present invention relates to a semiconductor device having a self-aligned contact structure and a manufacturing method thereof.

2. Description of the Background Art

As a degree of integration of a semiconductor device increases, a width of a wiring decreases and a space between the wirings also decreases. When a contact hole connecting upper and lower wirings is formed, the contact hole must be formed with a hole diameter smaller than a width of the space between adjacent wirings. That is, a hole diameter C of the contact hole required for design rules of 0.25 μm for the space between the adjacent wirings will be $C \leqq 0.25 - f(\alpha,\beta)$ μm, considering overlay accuracy ($=\alpha$) and dimensional accuracy ($=\beta$) in a photolithographic processing step, which exceeds a limit of size reduction depending on a wavelength of a light source of an exposure system.

To solve the above-described problem, a self-aligned contact technique has been used for manufacturing the semiconductor device of the 0.25 μm rules.

In a DRAM (Dynamic Random Access Memory), the self-aligned contact technique is mostly used for a bit line contact and a storage node contact formed between word lines within a memory cell array. The most important point is to connect the bit line or the storage node to a source/drain region of a memory cell transistor with a resistance as low as possible without making an electrical short circuit with a word line.

A manufacturing method of a background art using the self-aligned contact will now be described.

An active region electrically isolated by a silicon oxide film deposited on an element isolation region is formed. A gate electrode to be a word line of the DRAM is formed on a gate insulation film formed in the active region. The gate electrode and a nitride film hard mask thereon are covered with an etching resistance film formed by a nitride film similar to the hard mask. The gate electrode is then covered with a silicon oxide film including impurities of boron and phosphorus, and thereafter, a surface of the silicon oxide film is planarized.

Then, the silicon oxide film including impurities of boron and phosphorus is selectively etched to expose the etching resistance film. The exposed etching resistance film is etched to form a contact hole exposing a pair of source/drain regions. A polycrystal silicon film doped with an n type impurity is form to contact with each of the exposed pair of source/drain regions. As a result, a bit line contact electrically connecting a bit line with one of the source/drain regions, and a storage node contact electrically connecting a storage node with the other of the source/drain regions are formed. In this step, the bit line or the storage node can be connected to the source/drain region while the source/drain region and the gate electrode are electrically insulated.

A manufacturing method using the self-aligned contact is disclosed in, for example, Japanese Patent Laying-Open No. 2000-353793.

For design rules of at most 0.13 μm having an extremely narrow space between gate electrodes, a problem of an "aperture defect", or a problem of difficulty in ensuring a process tolerance of an electrical "short" of the gate electrode and the polycrystal silicon film occurs in the above-described background art because of a microloading effect caused by a difference in hole diameters of the bit line contact and the storage node contact. More specific descriptions are given below.

Proceeding of etching of the contact hole having a smaller hole diameter becomes hard by the microloading effect. Therefore, when the etching is performed in a condition suitable for the contact hole having a larger hole diameter, the etching proceeds insufficiently in the contact hole of the smaller hole diameter, resulting in the "aperture defect".

On the other hand, when the etching is performed in a condition suitable for the contact hole of the smaller hole diameter, the etching excessively proceeds in the contact hole of the larger hole diameter. As a result, the etching resistance film formed with a silicon nitride film is removed substantially in addition to the silicon oxide film, and the gate electrode is exposed. If the polycrystal silicon film is formed within the contact hole in this situation, the electrical "short" of the gate electrode and the polycrystal silicon film is generated. To avoid such "short", thickness of the etching resistance film must be increased, an thus decreasing of the thickness of the etching resistance film becomes difficult.

Formation of a photoresist pattern by scaling of a pattern pitch of the storage node contact and the bit line contact is also difficult. A problem is that, a contact resistance is increased when the hole diameter is small, while a hole coupling (an electrical short) will be generated when the diameter is increased.

In particular, as a channel width of the memory cell transistor in the DRAM is decreased and current drivability is also decreased, the contact resistance must be made equal to or lower than that in a previous generation despite the size reduction to attain a stable cell operation. Therefore, a breakthrough in the conventional technique is needed.

SUMMARY OF THE INVENTION

The present invention is made to solve the problems as described above. An object of the present invention is to provide a semiconductor device allowing significant enlargement of a margin in a photolithographic process, suppression of an "aperture defect" as well as ensuring of a process tolerance of a "short" by decreasing a microloading effect, and decrease in a contact resistance, and to provide a manufacturing method thereof.

A semiconductor device according to the present invention includes a semiconductor substrate, a transistor, a hard mask layer, and first and second plug conductive layers. The semiconductor substrate has a main surface and an active region surrounded with an element isolation structure on the main surface. The transistor has a pair of source/drain regions formed on a surface of the active region and a gate electrode layer located on a region sandwiched between the pair of source/drain regions and extending across the active region. The hard mask layer is formed on the gate electrode layer and has a plane pattern shape identical with that of the gate electrode layer. Each of the first and second plug conductive layers is electrically connected to each of the pair of source/drain regions. An extending direction of the active region is not perpendicular to that of the gate electrode layer, but is oblique. An upper surface of the hard mask layer and an upper surface of each of the first and second plug conductive layers form substantially an identical plane.

As the extending direction of the active region is oblique, not perpendicular, to the extending direction of the gate electrode layer, a larger pitch between the active regions can be ensured as compared with the active region perpendicular to the gate electrode layer. Therefore, a margin of a photolithographic process significantly increases, which allows the photolithographic process with light of a long wavelength or a use of an exposure device having a low NA (Numerical Aperture), resulting in easy cost reduction.

In addition, since the upper surface of the hard mask layer and the upper surface of each of the first and second plug conductive layers form substantially an identical plane, there is no difference in level between the upper surfaces. As a result, an upper surface of a layer formed above the hard mask layer and the first and second plug conductive layers can easily be planarized so that a process such as patterning of the layer with the photolithographic process or the like can easily be performed. Thus, a process margin of a subsequent process can be ensured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will now be described based on the drawings.

First Embodiment

Figure 1:
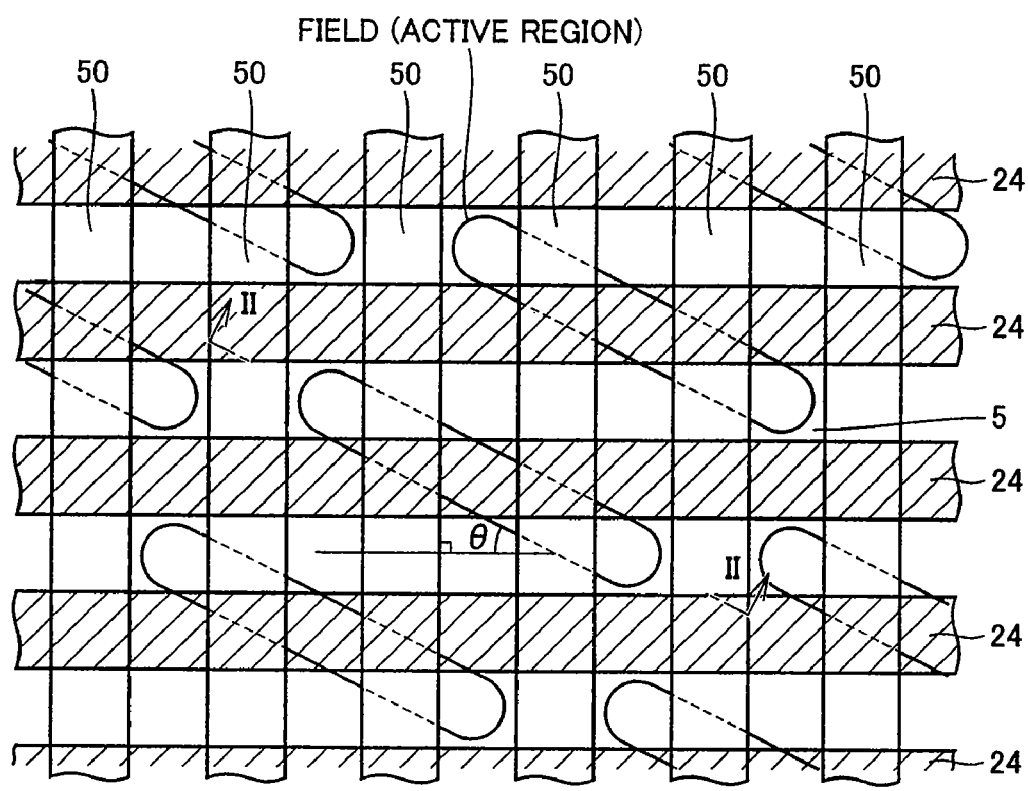
FIG. 1 is a schematic plan view of a construction of a semiconductor device according to a first embodiment of the present invention, showing a portion of a memory cell array of a DRAM.

Referring mainly to FIG. 1, in a memory cell array of a DRAM, for example, each of a plurality of word lines (gate electrode layers) 50 and each of a plurality of bit lines 24 are arranged perpendicular to each other. A memory cell is arranged near an intersecting portion of each word line 50 and each bit line 24. A memory cell transistor is formed in an active region (field). A plurality of such active regions are arranged.

Figure 2:
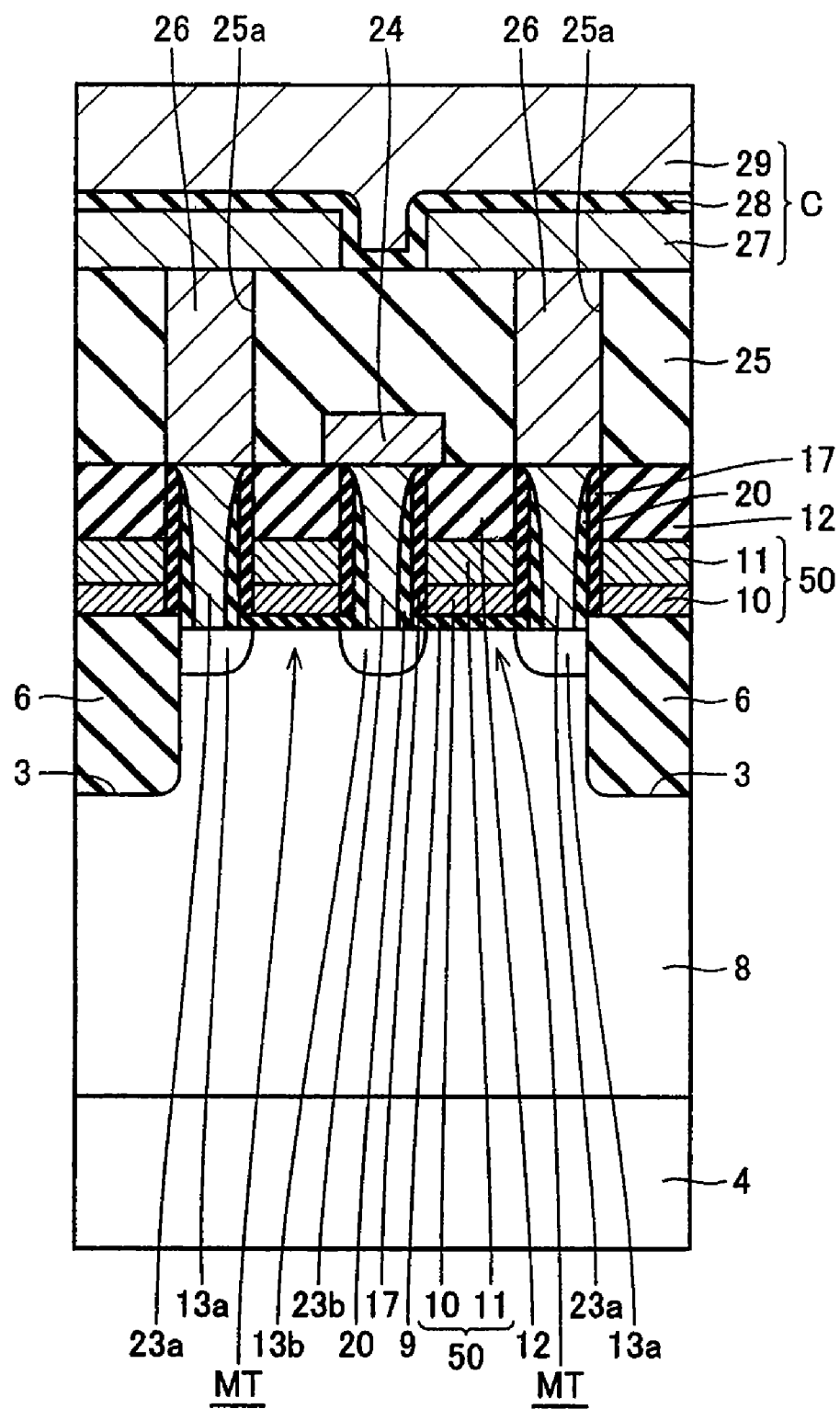
FIG. 2 is a schematic cross-sectional view taken along the line II-II in FIG. 1.

Referring mainly to FIG. 2, each of the plurality of active regions is surrounded with an element isolation structure on a surface of a semiconductor substrate 4 formed with, for example, a silicon substrate. The element isolation structure is formed with, for example, an STI (Shallow Trench Isolation) structure. The STI structure has a shallow trench 3 formed on a surface of semiconductor substrate 4 and an embedded insulation layer (which is, for example, a silicon oxide film) 6 embedded in shallow trench 3.

The memory cell has a memory transistor MT formed with an MOSFET (Metal Oxide Semiconductor Field Effect Transistor) and a capacitor C.

Memory transistor MT has a pair of source/drain regions 13a, 13b, a gate insulation film 9 and gate electrode layer 50. The pair of source/drain regions 13a, 13b have, for example, an n conductivity type, and are formed spaced apart from each other on a surface of a p type well 8. Gate electrode layer 50 is formed on a region sandwiched between the pair of source/drain regions 13a, 13b via gate insulation film 9. Gate insulation film 9 is formed with, for example, a silicon oxide film, while gate electrode layer 50 is formed with a stacked structure of, for example, a polycrystal silicon film 10 doped with an impurity (hereafter referred to as a doped polysilicon film) and a metal film (such as tungsten) 11.

On gate electrode layer 50, a hard mask layer 12 having the same plane pattern shape as gate electrode layer 50 is formed. Sidewall insulation films 17, 20 having sidewall forms are formed on sidewalls of gate electrode layer 50 and hard mask layer 12.

Each of plug conductive layers 23a, 23b, which is formed with doped polysilicon of an n type, for example, is electrically connected to each of the pair of source/drain regions 13a, 13b. Bit line 24 is electrically connected to plug conductive layer 23b. An interlayer insulation film 25 is formed to cover memory transistor MT, bit line 24 and the like. A hole 25a is formed in interlayer insulation film 25, and an embedded conductive layer 26 is embedded in hole 25a.

Capacitor C has a storage node (a lower electrode) 27, a capacitor dielectric film 28 and a cell plate (an upper electrode) 29. Storage node 27 is formed on interlayer insulation film 25 and is electrically connected to source/drain region 13a via embedded conductive layer 26 and plug conductive layer 23a. Cell plate 29 is formed opposed to storage node 27 with capacitor dielectric film 28 interposed therebetween.

In a construction as described above, the active region extends in a direction not perpendicular to an extending direction of word line (gate electrode layer) 50, but in an oblique direction, as shown in FIG. 1. In other words, the active region has a long shape extending in a direction from one of the pair of source/drain regions toward the other, and the extending direction of the active region forms an angle θ with a direction perpendicular to the extending direction of word line (gate electrode layer) 50. It is to be noted that, word line (gate electrode layer) 50 extends across the active region.

In addition, as shown in FIG. 2, an upper surface of each of plug conductive layers 23a, 23b, an upper surface of hard mask layer 12, and an upper surface of a BPTEOS (boro phospho tetra etyle ortho silicate) oxide film 21 described below form substantially an identical plane. In other words, the upper surface of each of plug conductive layers 23a, 23b, the upper surface of hard mask layer 12, and the upper surface of BPTEOS oxide film 21 are located within an identical plane.

A manufacturing method according to this embodiment will now be described.

Figure 3:
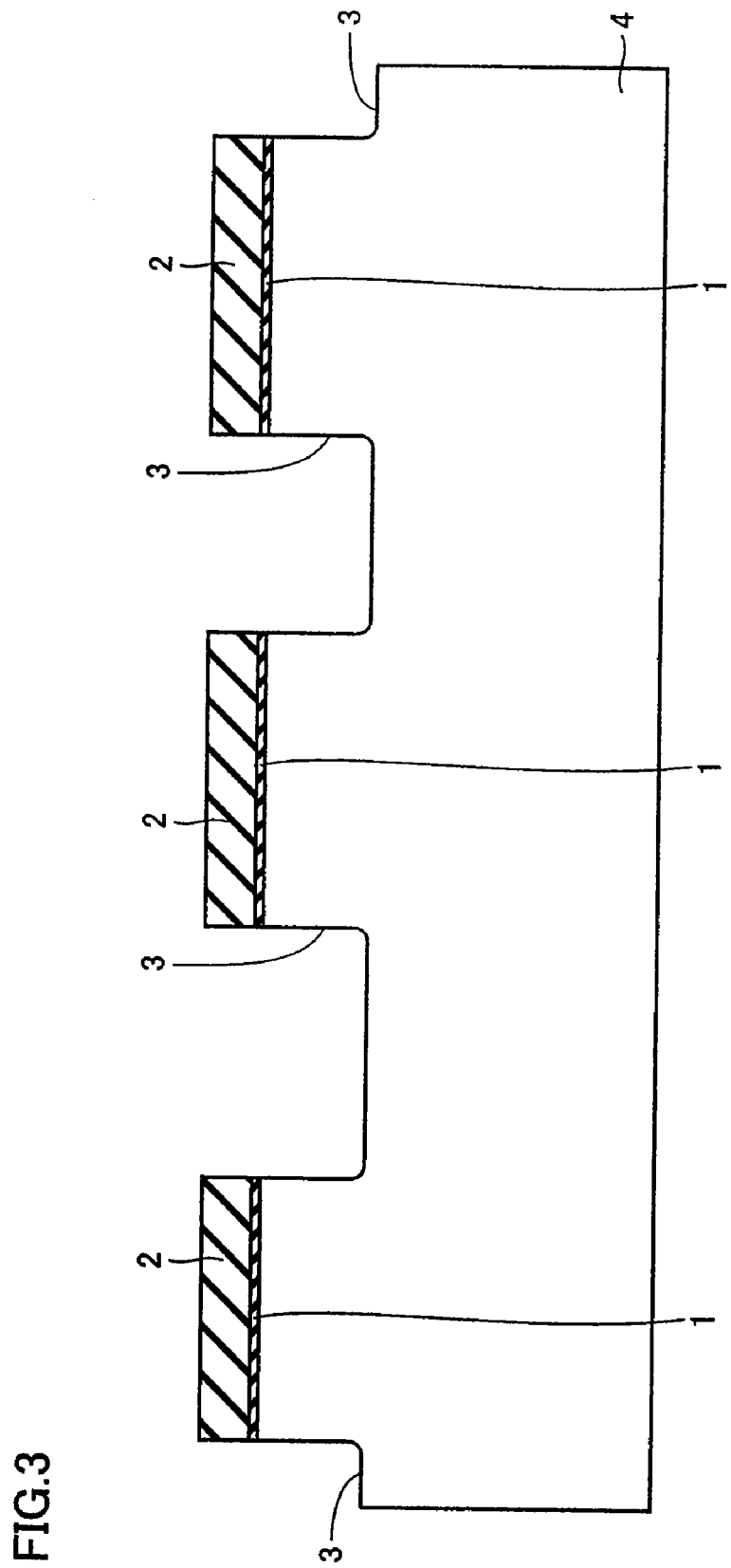
FIGS. 3 to 21 are schematic cross-sectional views respectively showing first to nineteenth steps of a manufacturing method of the semiconductor device according to the first embodiment of the present invention.

Referring to FIG. 3, a buffer insulation film 1 having thickness of 15 nm is formed on silicon substrate (semiconductor substrate) 4. Buffer insulation film 1 can be formed by, for example, wet oxidation of a surface of silicon substrate 4. A silicon nitride film 2 having thickness of 100 nm is formed by a CVD (Chemical Vapor Deposition) method or the like on silicon substrate 4 having buffer insulation film 1 formed thereon.

A photoresist pattern (not shown) is formed on silicon nitride film 2 by photolithographic processing. Anisotropic etching by a dry etching method is performed for a stacked film of silicon nitride film 2 and buffer insulation film 1 using the photoresist pattern as a mask. After the photoresist is removed, anisotropic etching of silicon substrate 4 by the dry etching method is performed using the stacked film of silicon nitride film 2 and buffer insulation film 1 as a mask to form shallow trench 3 having a depth of 250 nm. Then, thermal oxidation of a sidewall and a bottom wall of shallow trench 3 is performed to remove damage caused by formation of shallow trench 3.

Figure 4:
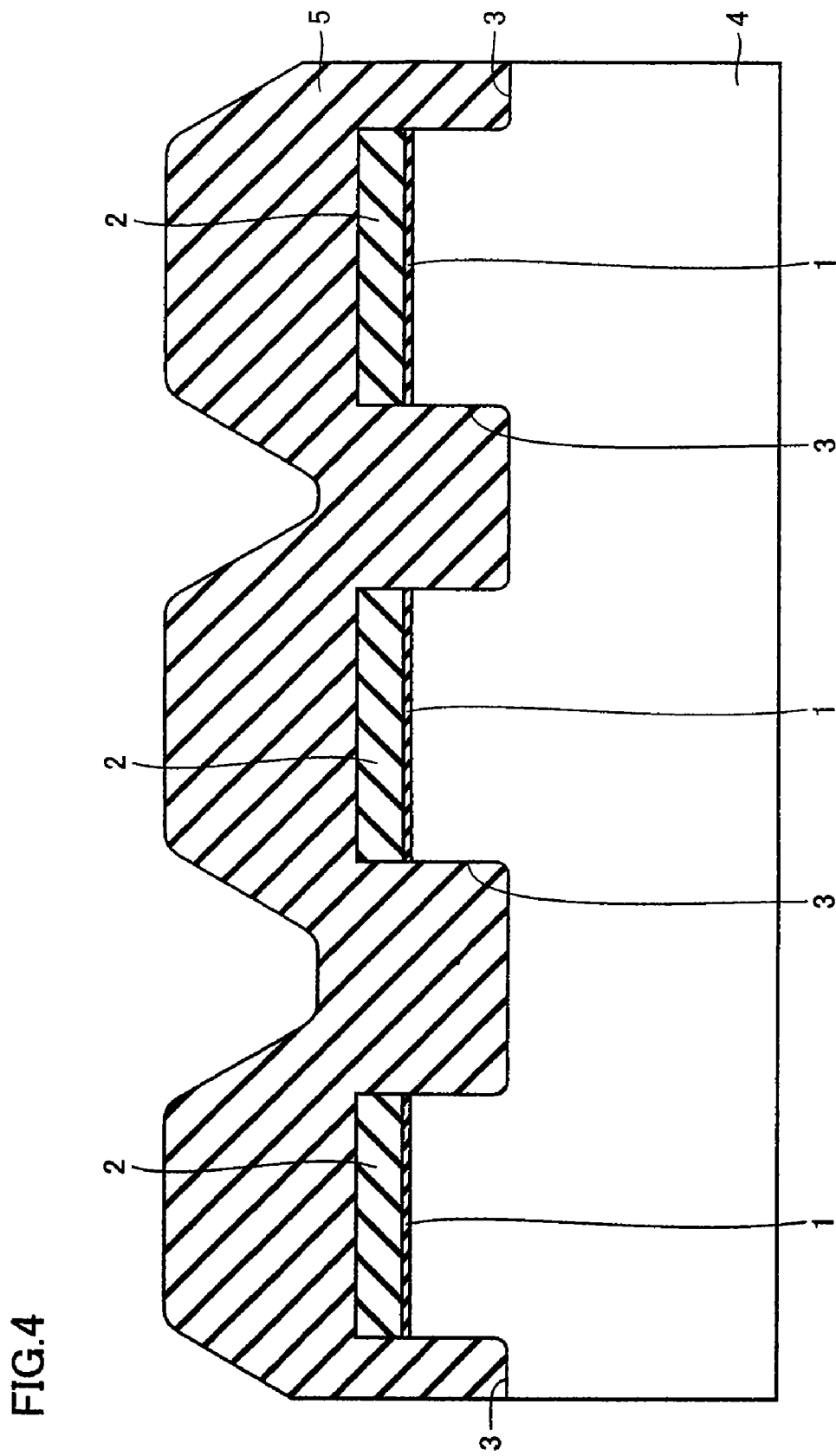

Referring to FIG. 4, a silicon oxide film 5 is deposited to be embedded in shallow trench 3 and to cover the surface of silicon substrate 4. A deposition method of silicon oxide film 5 preferably has a good step coverage ability. A CVD method using an HDP (high density plasma) is preferred.

Figure 5:
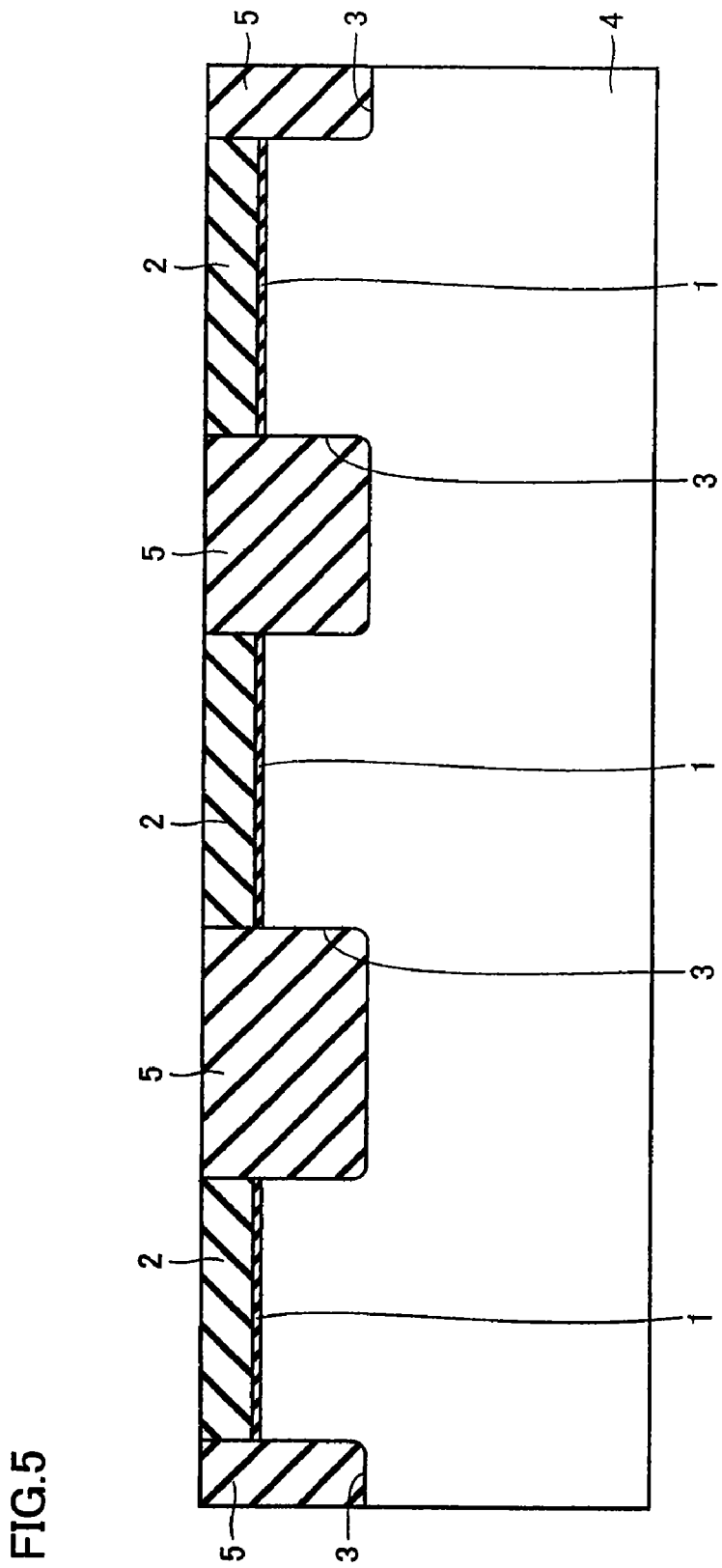

Referring to FIG. 5, silicon oxide film 5 is polished and removed by CMP (Chemical Mechanical Polishing) using silicon nitride film 2 as a stopper of the CMP until an upper surface of silicon nitride film 2 is exposed, and silicon oxide film 5 remains in shallow trench 3. As a result, the STI structure is completed and, at the same time, a processed surface is planarized. After the CMP, heat processing is performed in an Ar (argon) atmosphere, for example, to density silicon oxide film 5 forming the STI structure. Thereafter, a portion of silicon oxide film 5 is removed to a level of buffer insulation film 1, and then silicon nitride film 2 is removed.

Figure 6:
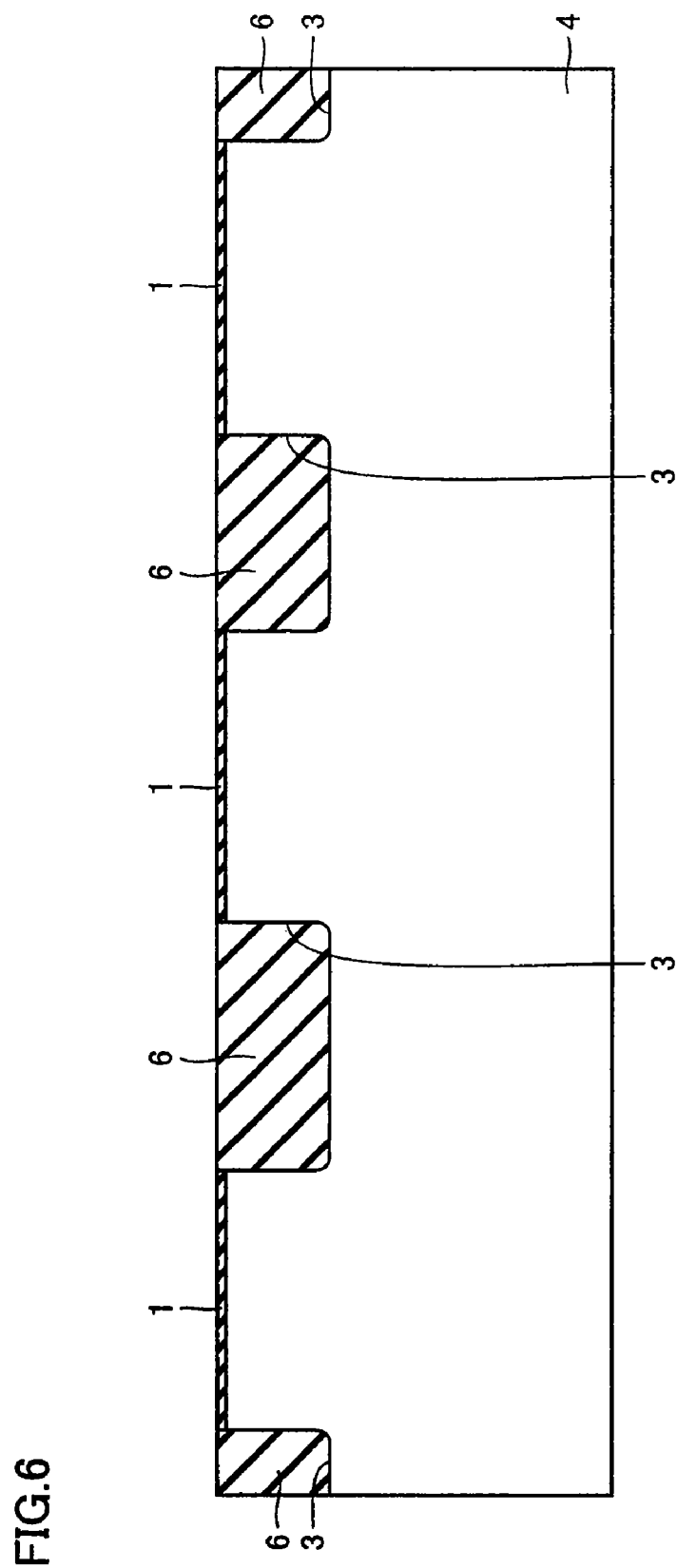

Referring to FIG. 6, buffer insulation film 1 is exposed by removing of silicon nitride film 2 as described above.

Figure 7:
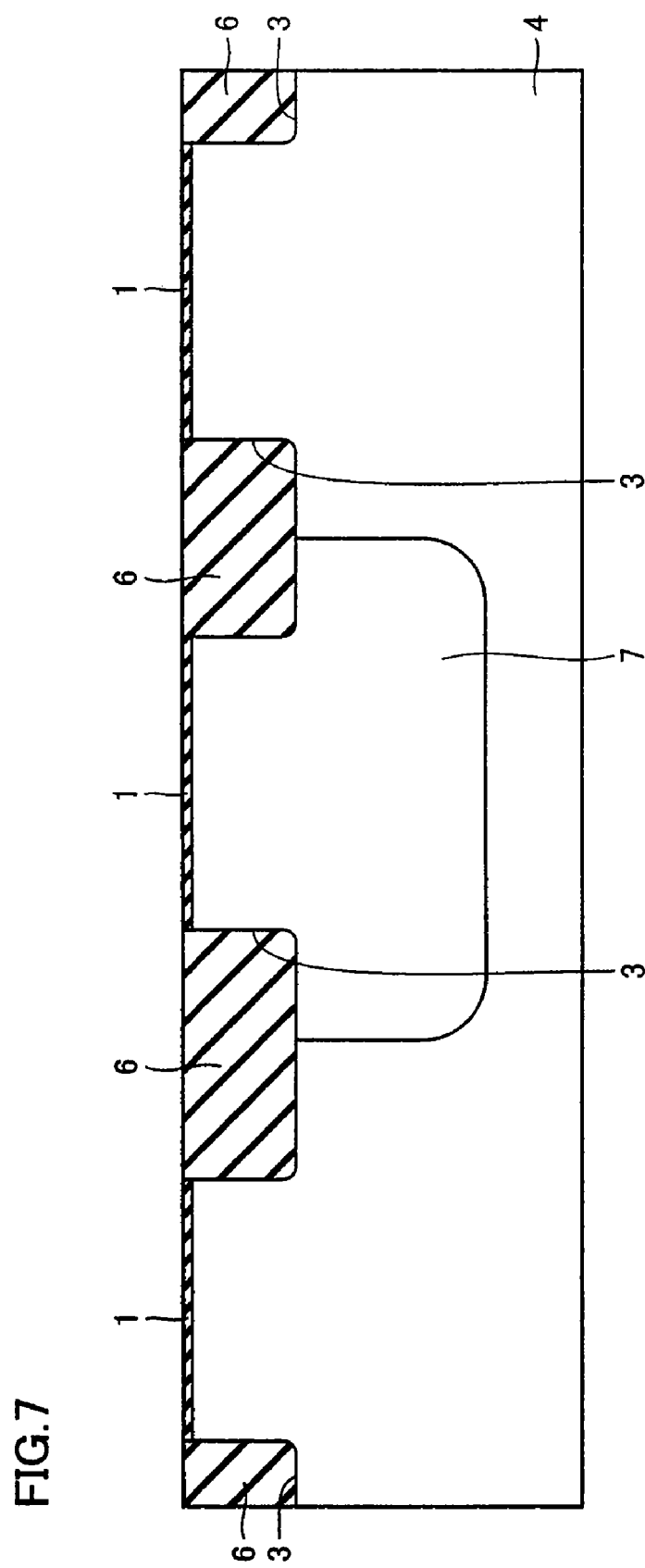

Referring to FIG. 7, an n type well 7 is formed in a surface of silicon substrate 4 by ion injection into silicon substrate 4 using the photoresist pattern (not shown) formed above silicon substrate 4 as a mask. The ion injection step is performed as necessary and a threshold voltage of the transistor is adjusted according to a designed circuit. Thereafter, the photoresist pattern is removed.

Figure 8:
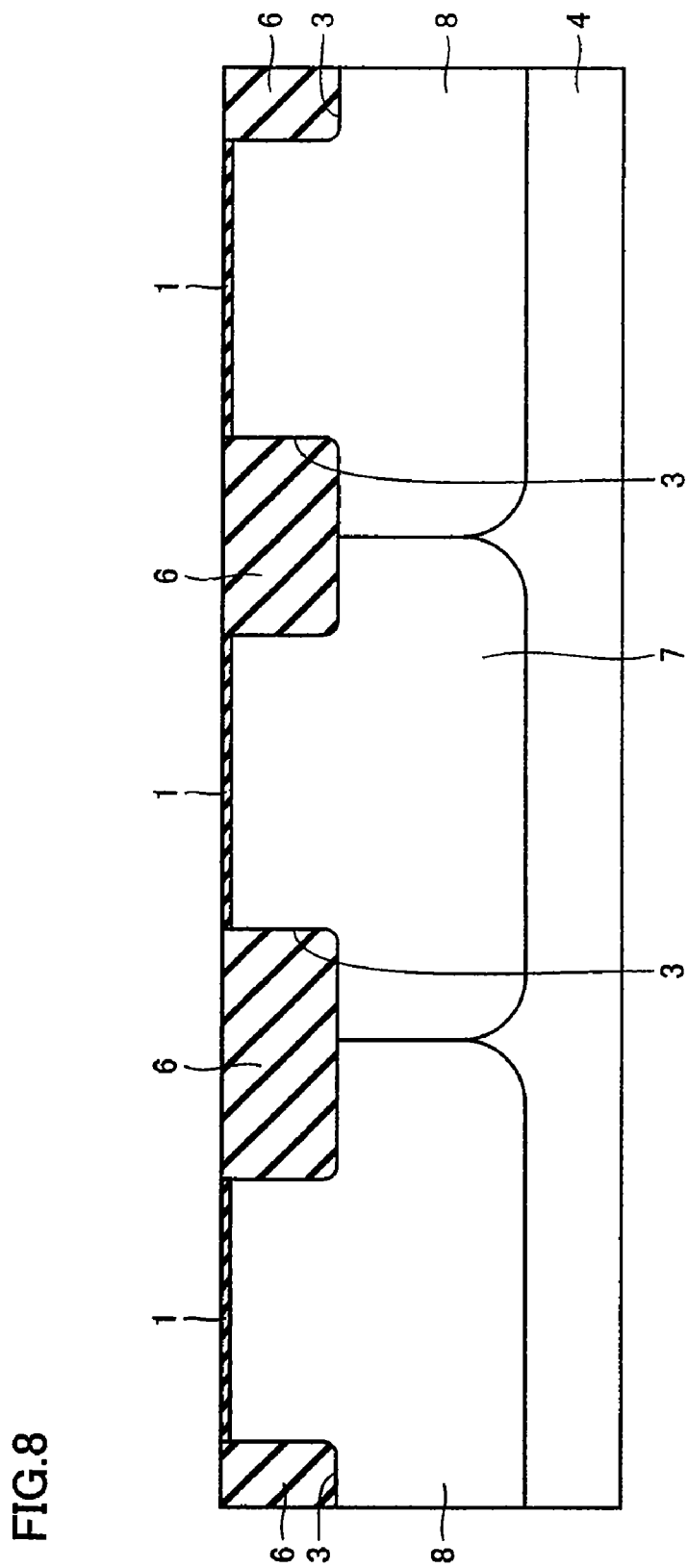

Referring to FIG. 8, a p type well 8 is formed in a surface of silicon substrate 4 by ion injection into silicon substrate 4 using the photoresist pattern (not shown) formed above silicon substrate 4 as a mask. The ion injection step is performed as necessary and the threshold voltage of the transistor is adjusted according to the designed circuit. Thereafter, the photoresist pattern is removed.

Then, buffer insulation film 1 above silicon substrate 4 is removed to expose the surface of silicon substrate 4.

Figure 9:
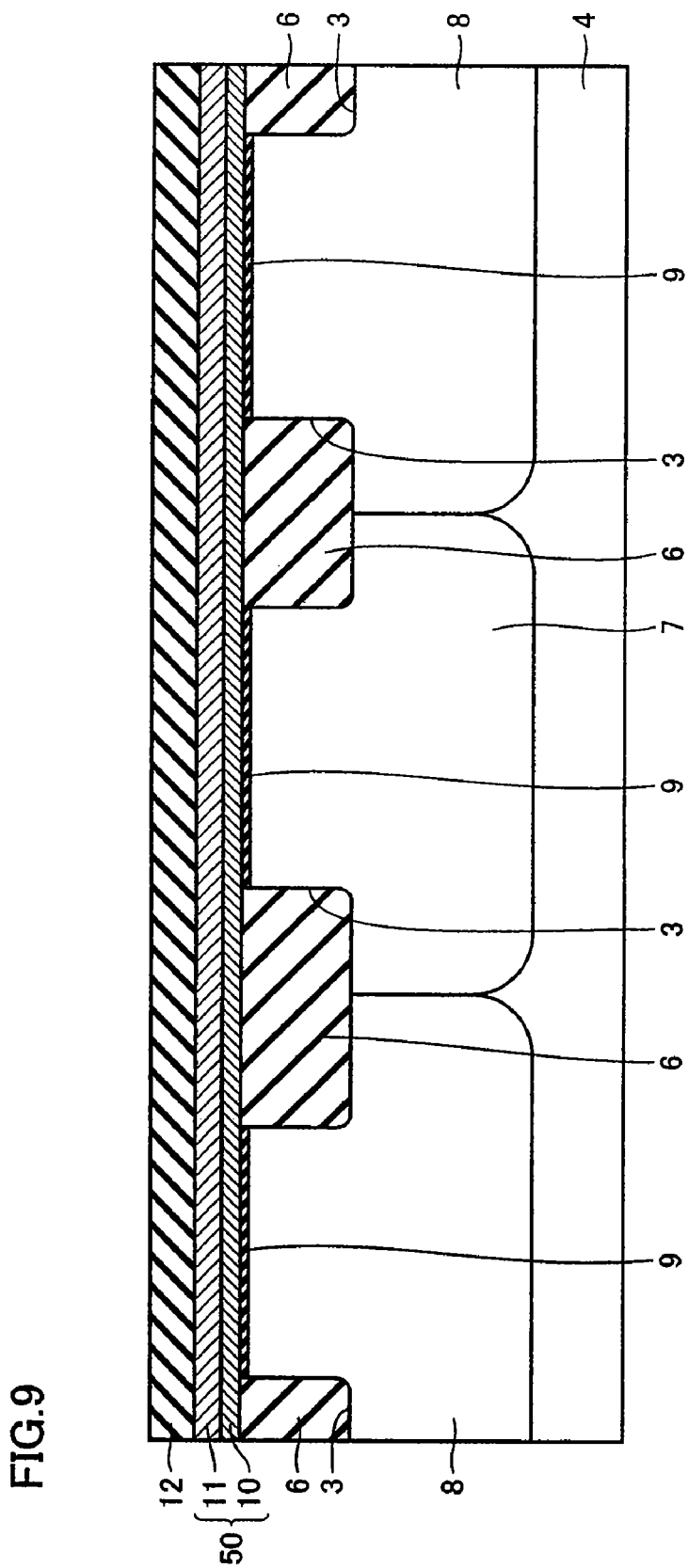

Referring to FIG. 9, thermal oxidation of the exposed surface of silicon substrate 4 is performed to form a gate oxide film 9. Then, an n type doped polysilicon film 10 having thickness of 50 nm is formed above silicon substrate 4 by, for example, the CVD method. A buffer layer (not shown) formed with WSiN having thickness of 5 nm is formed on n type doped polysilicon film 10 by, for example, a sputtering method. On the buffer layer (not shown), a metal film 11 formed with W (tungsten) having thickness of 50 nm is formed by, for example, the sputtering method. Furthermore, a cap film (hard mask layer) 12 formed with a silicon nitride film having thickness of 200 nm is formed on metal film 11 by, for example, the CVD method.

Figure 10:
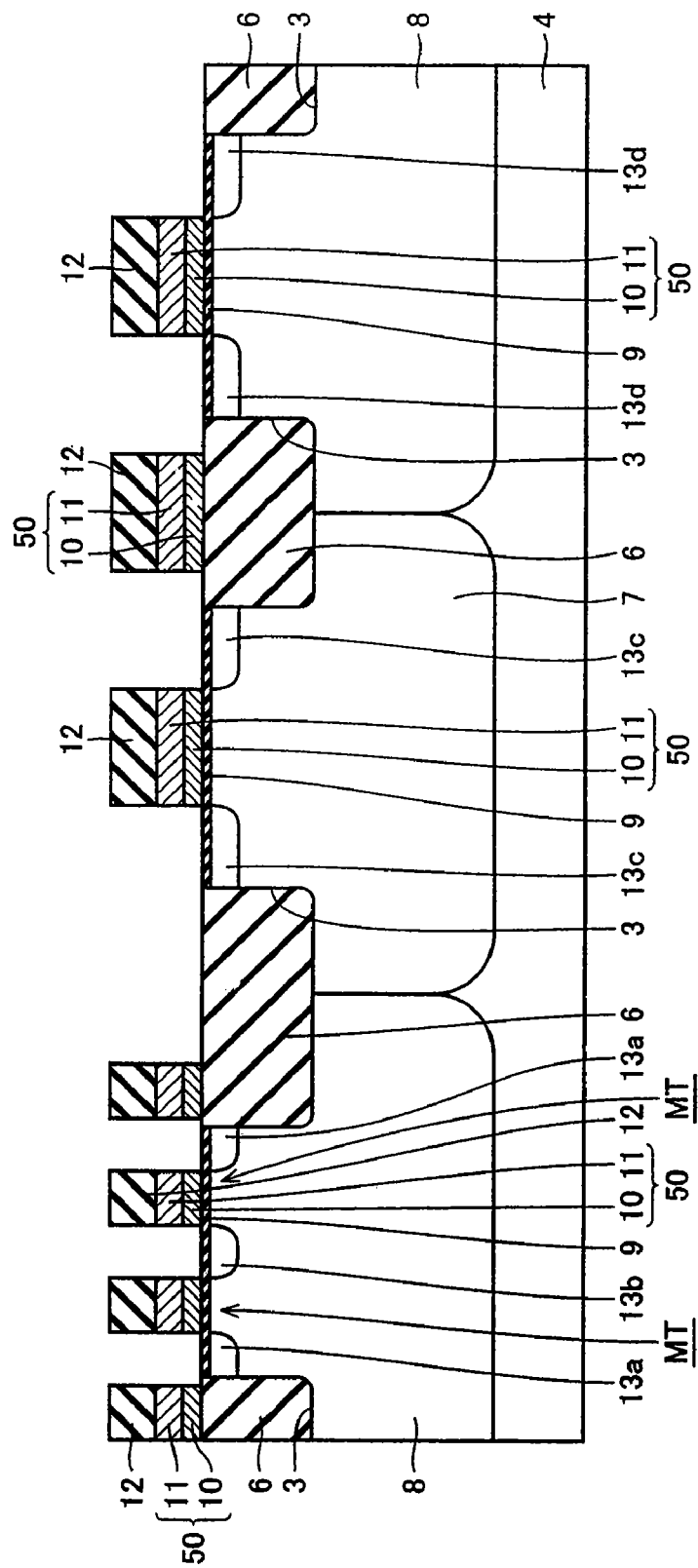

Referring to FIG. 10, cap film 12, metal film 11, buffer layer (not shown), and n type doped polysilicon film 10 are patterned by a photolithographic technique. As a result, gate electrode layer 50 having a polymetal structure formed with n type doped polysilicon film 10, buffer layer (not shown) and metal film 11 and having an upper surface covered with cap film 12 is formed.

Figure 22:
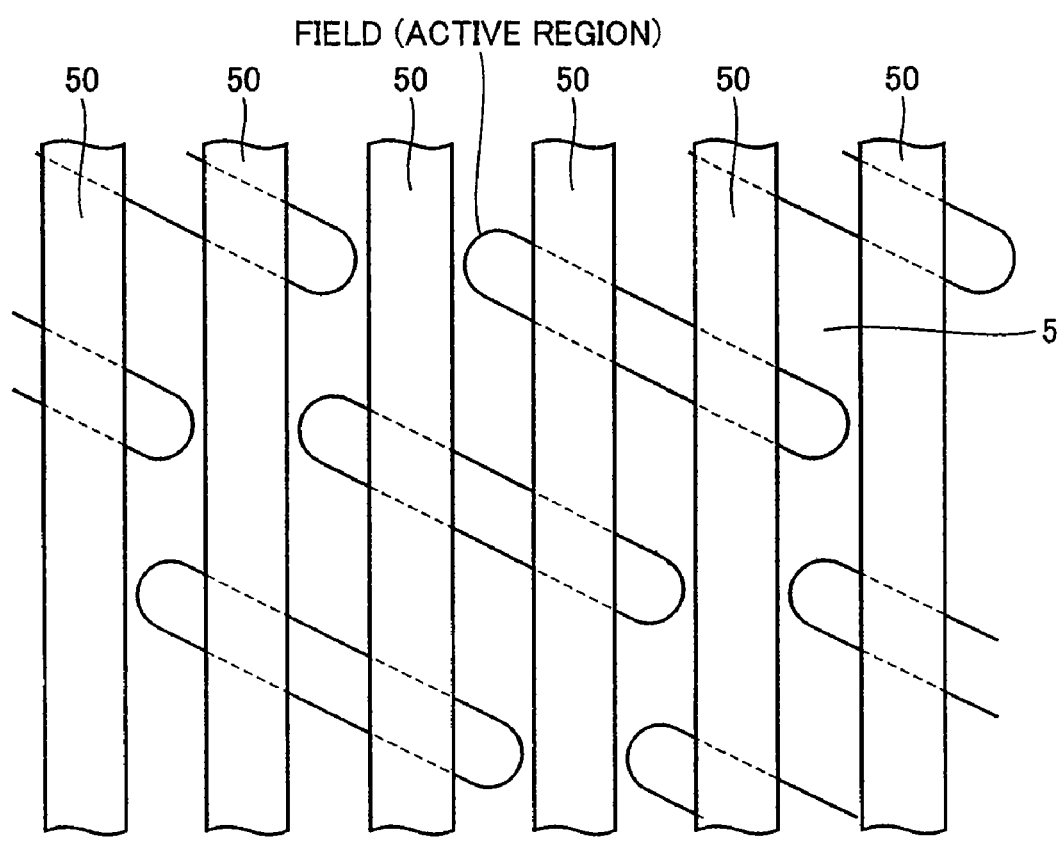
FIG. 22 is a schematic plan view of the memory cell array of the DRAM in a state shown in FIG. 10.

A schematic plan view of the memory cell array of the DRAM in this state is as shown in FIG. 22. That is, a plurality of active regions (fields) are formed in silicon substrate 4, and each of the plurality of active regions is surrounded by the STI structure, as shown in FIG. 22. A plurality of word lines formed with gate electrode layers 50 are extending across the active regions. The active region extends in a direction not perpendicular to an extending direction of word line (gate electrode layer) 50, but in an oblique direction. As such, a stacked pattern of successively stacked gate electrode layer 50 and cap film 12 is formed to extend across the active region in a direction not perpendicular to the extending direction of the active region, but in an oblique direction.

Thereafter, a silicon oxide film (not shown) is formed selectively on a sidewall portion of n type doped polysilicon film 10 without oxidizing metal film 11 and the buffer layer (not shown). Then, ion injection of a whole surface of a wafer is performed without a photoresist mask using gate electrode layer 50 as a mask. As a result, in silicon substrate 4 on either side of gate electrode layer 50, shallow and low-concentration n type impurity diffused regions 13a, 13b of extension source/drain, an n type impurity diffused region 13c formed in a p type MOSFET region, and an n type impurity diffused region 13d formed in an n type MOSFET region are formed. N type impurity diffused regions 13a-13d are formed by injection of P (phosphorus) ions with, for example, acceleration energy of 10 keV and a dose of $2\times10^{13}$ cm$^{-2}$. As a result, a pair of source/drain regions 13a, 13b are formed so as to sandwich gate electrode layer 50 therebetween on a surface of the active region within the memory cell array.

Figure 11:
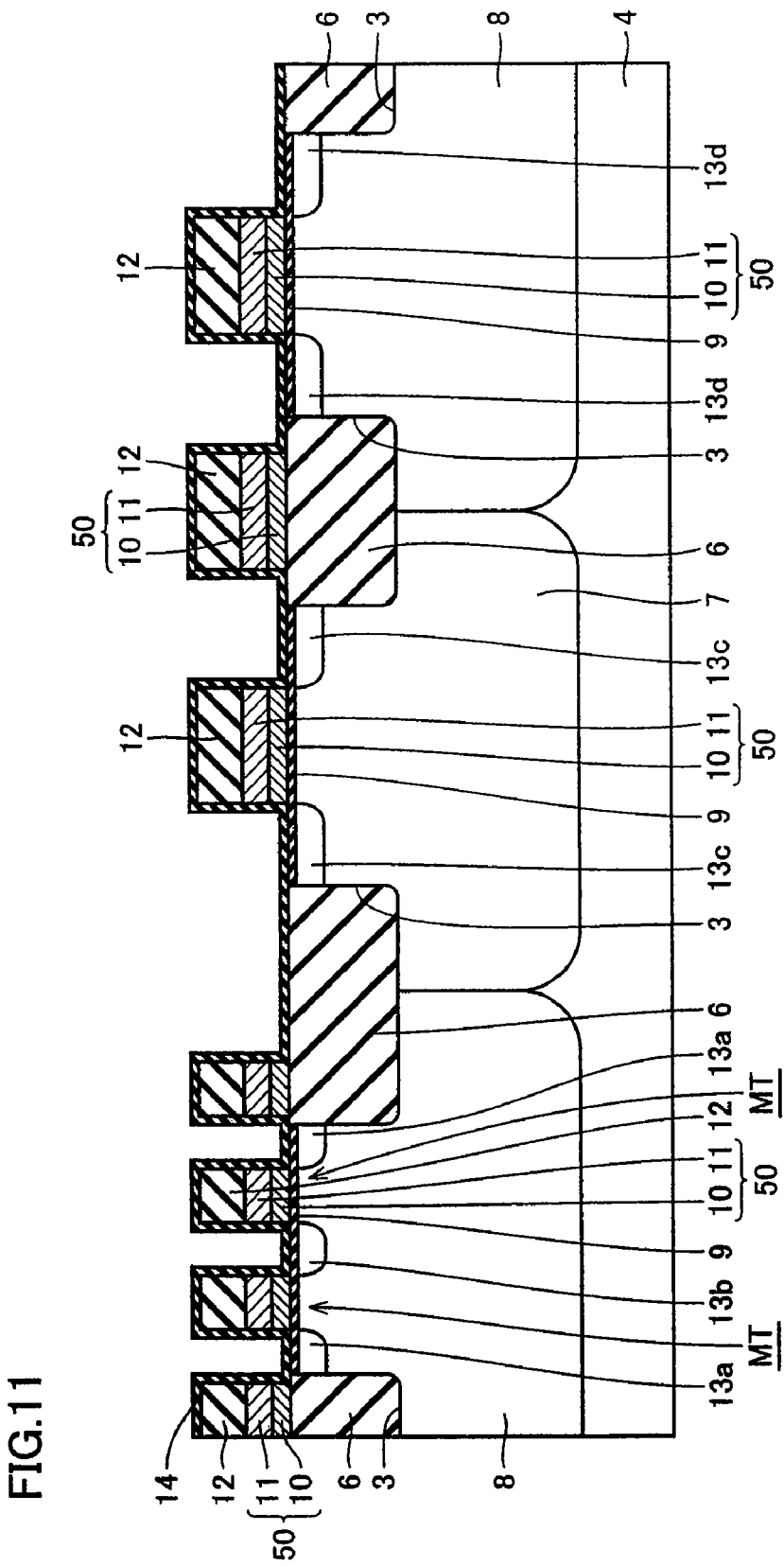

Referring to FIG. 11, a silicon nitride film 14 having thickness of 15 nm is formed on a whole surface by, for example, the CVD method.

Figure 12:
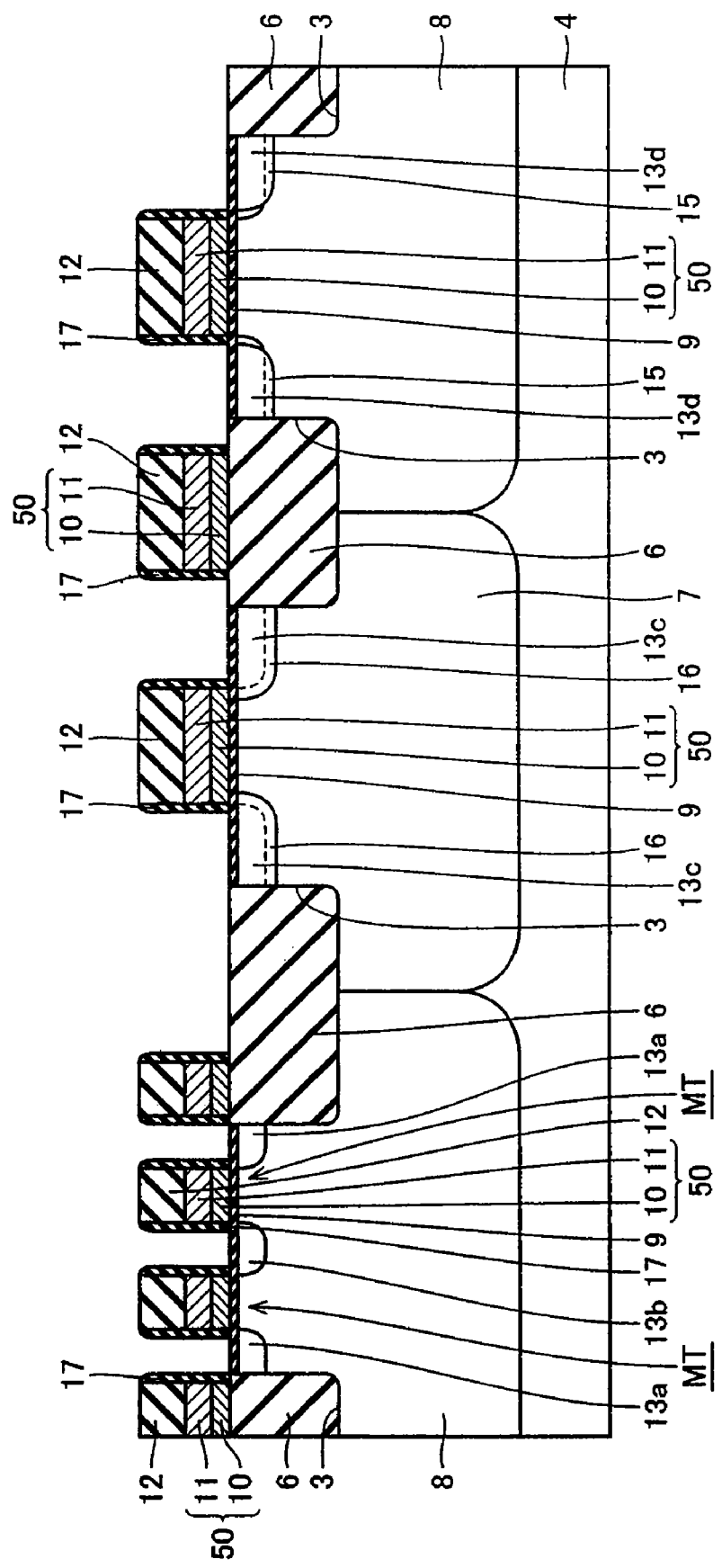

Referring to FIG. 12, silicon nitride film 14 is anisotropically etched, and sidewall insulation film 17 formed with a silicon nitride film is formed on sidewalls of gate electrode layer 50 and cap film 12. Though silicon substrate 4 may be penetrated with anisotropic etching when sidewall insulation film 17 is formed, it is desirable to use an anisotropic etching method having a high selection ratio to gate oxide film 9, not to damage silicon substrate 4 by the etching.

Thereafter, ion injection is performed using gate electrode layer 50 and sidewall insulation film 17 as a mask, with which a deep region of the extension source/drain is formed. When an impurity diffused region 15 of an n type MOSFET is formed, As (arsenic) ions are injected with, for example, acceleration energy of 55 keV and a dose of $4\times10^{15}$ cm$^{-2}$. When an impurity diffused region 16 of a p type MOSFET is formed, $BF_2$ (boron fluoride) ions are injected with, for example, acceleration energy of 40 keV and a dose of $4\times10^{15}$ cm$^{-2}$. Then, heat processing at 900° C. for 10 seconds, for example, is performed by a lamp annealing method in a nitrogen atmosphere to electrically activate the impurity injected into impurity diffused regions 15, 16 to form the source/drain region.

Figure 13:
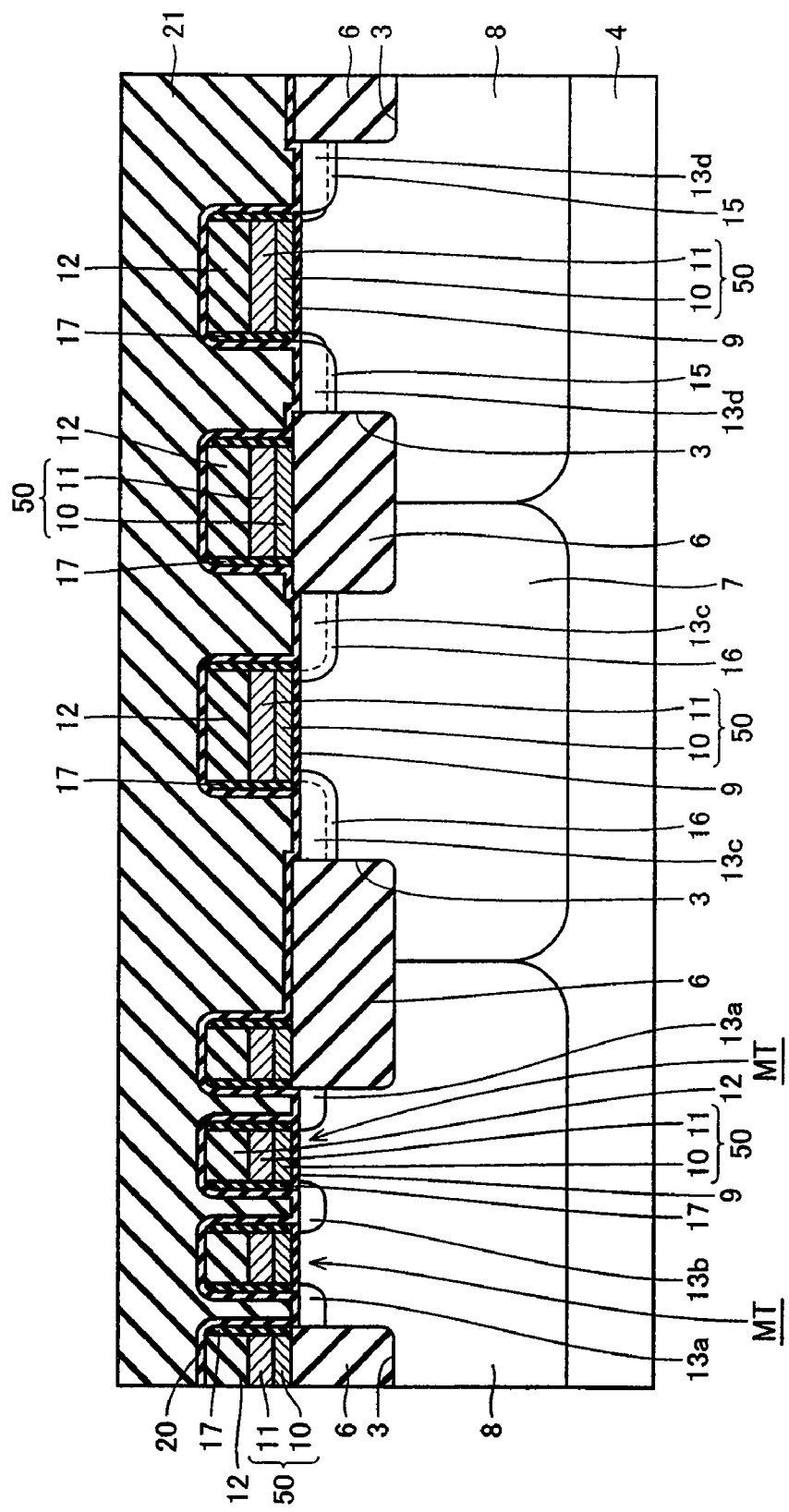

Referring to FIG. 13, an etching resistance film 20 formed with a silicon nitride film having thickness of 20 nm is formed on silicon substrate 4 to cover cap film 12 and sidewall insulation film 17 by, for example, the CVD method. Then, a TEOS oxide film 21 doped with an impurity and having thickness of 80 nm is deposited on etching resistance film 20 by, for example, the CVD method using TEB, TEPO and TEOS as material gases. Then, heat processing at 950° C. for 10 seconds, for example, is performed by the lamp annealing method in an oxygen atmosphere, doped TEOS oxide film 21 is reflowed and a gap between gate electrode layers 50 is filled. Thereafter, doped TEOS oxide film 21 is polished for thickness of 200 nm by, for example, the CMP. With this step, an upper surface (processed surface) of doped TEOS oxide film 21 is planarized.

Figure 14:
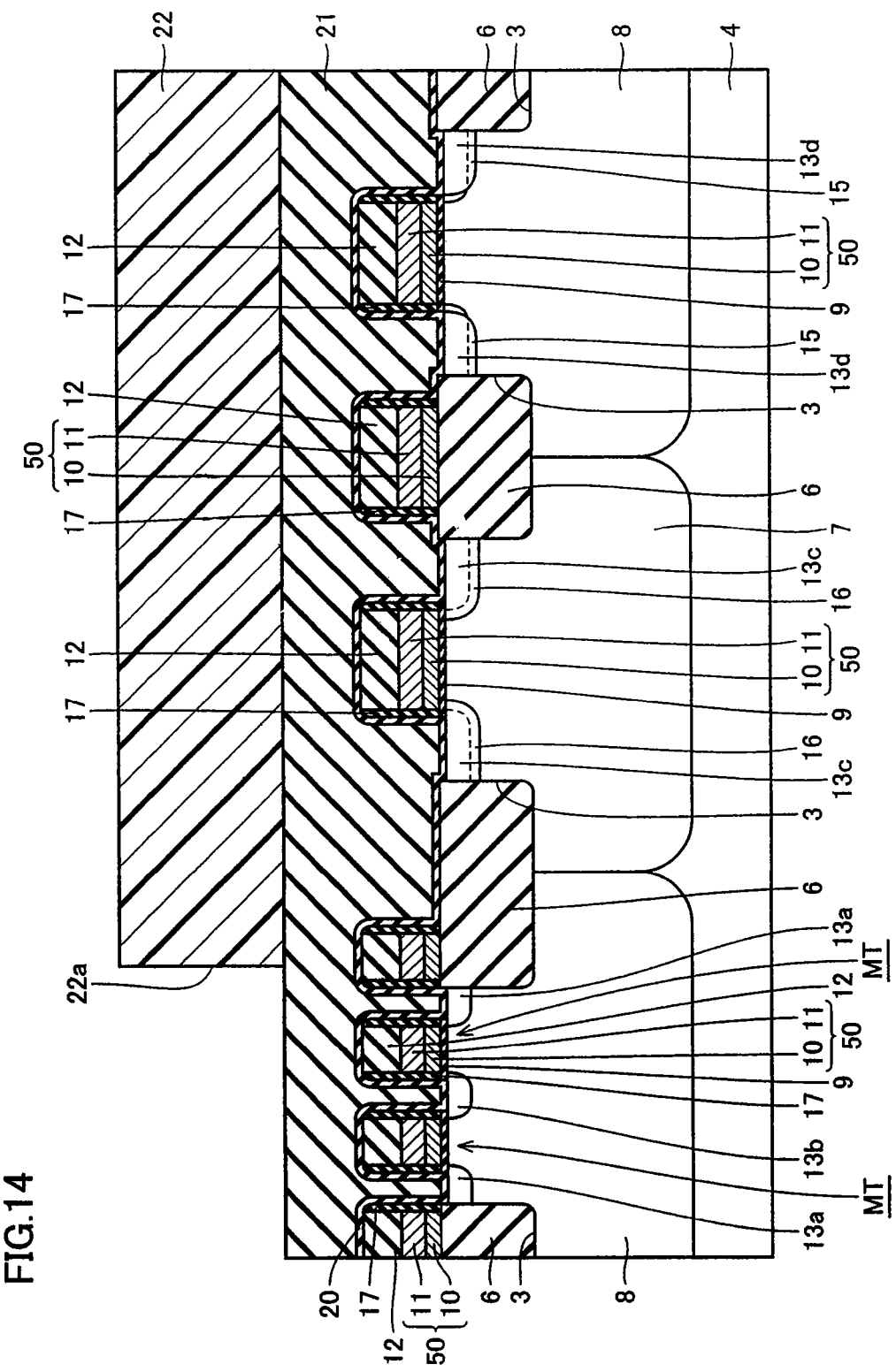

Referring to FIG. 14, a photoresist pattern 22 is formed on doped TEOS oxide film 21 using the photolithographic technique.

Figure 23:
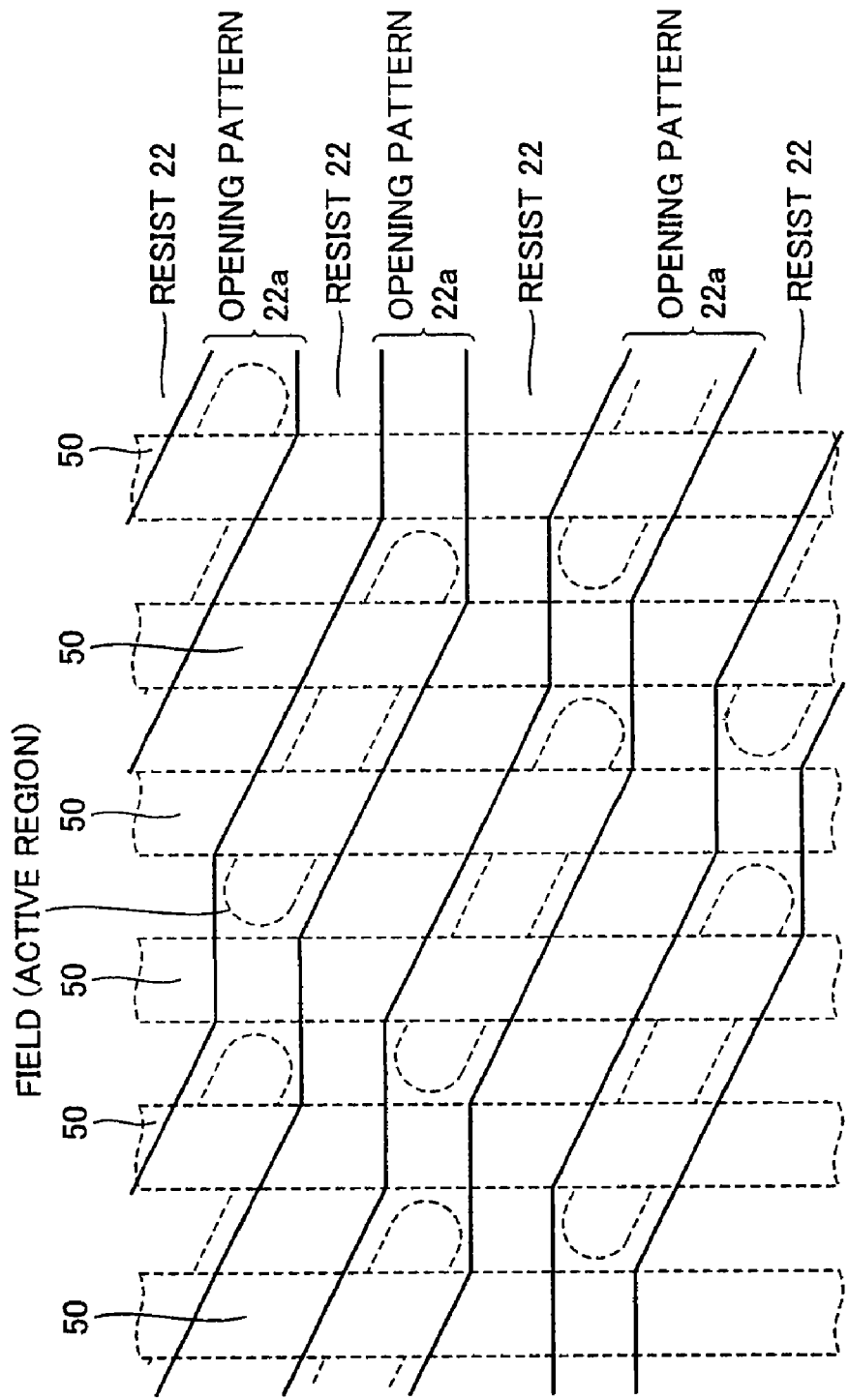
FIG. 23 is a schematic plan view of the memory cell array of the DRAM in a state shown in FIG. 14.

A schematic plan view of photoresist pattern 22 in the DRAM memory cell array is as shown in FIG. 23. That is, as shown in FIG. 23, photoresist pattern 22 has a plurality of band-shaped opening patterns 22a extending in parallel with each other. Each of the plurality of band-shaped opening patterns 22a extends non-linearly, and is formed so as to open a region above each of the whole active region.

Referring back to FIG. 14, anisotropic dry etching is performed to doped TEOS oxide film 21 using etching resistance film 20 as an etching stopper and photoresist pattern 22 having such opening pattern 22a as a mask.

Figure 15:
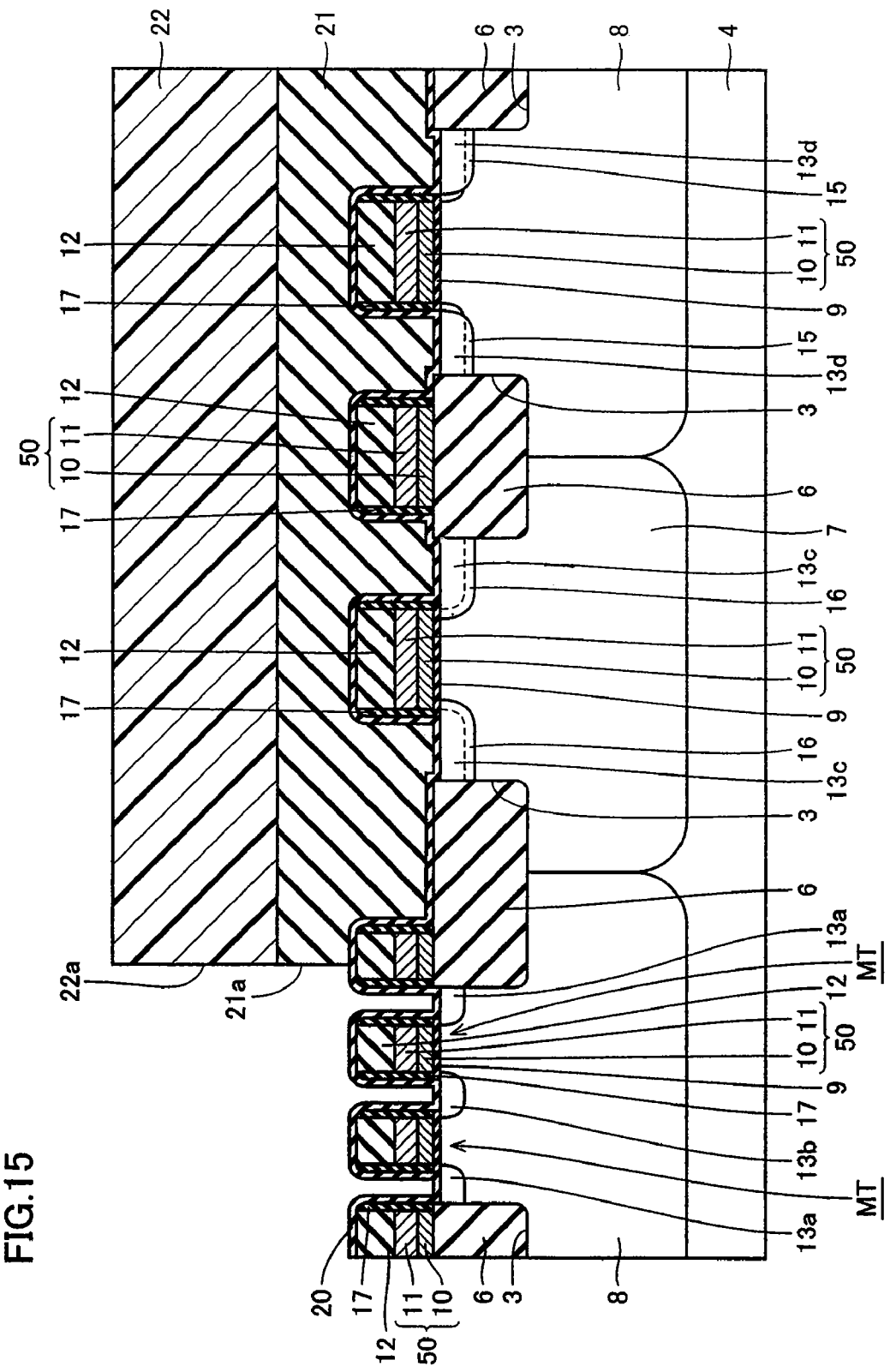

Referring to FIG. 15, an opening 21a extending non-linearly so as to open the region above each of the whole active region is formed in doped TEOS oxide film 21 by the aforementioned dry etching, and a surface of etching resistance film 20 is exposed from opening 21a. Thereafter, a width of the oxide film (such as doped TEOS oxide film 21) is decreased to enlarge a storage node contact and bit line contact region, and the oxide film is wet-etched with hydrofluoric acid to decrease a contact resistance. By optimizing an amount of the wet etching, a top diameter of a plug formed with doped polysilicon in the next process can be increased maximally, alignment accuracy of the stacked bit line contact and storage node contact can be ensured and, at the same time, a stable low resistance contact can be formed.

Figure 16:
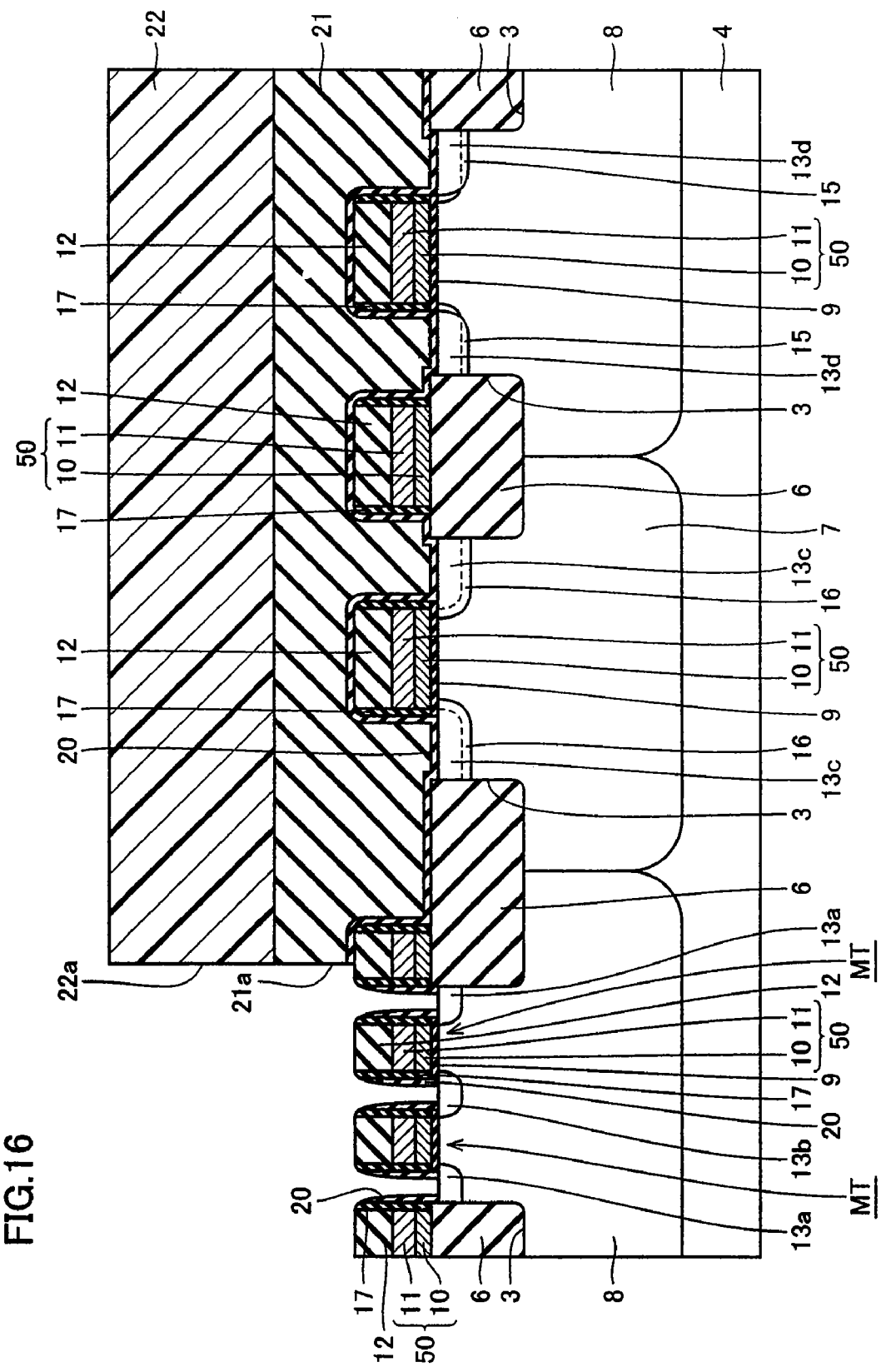

Referring to FIG. 16, anisotropic dry etching is performed to etching resistance film 20 exposed from opening 21a. As a result, each of the pair of source/drain regions 13a, 13b of memory transistor MT in the memory cell array is exposed in opening 21a. Thereafter, photoresist pattern 22 is removed.

Figure 17:
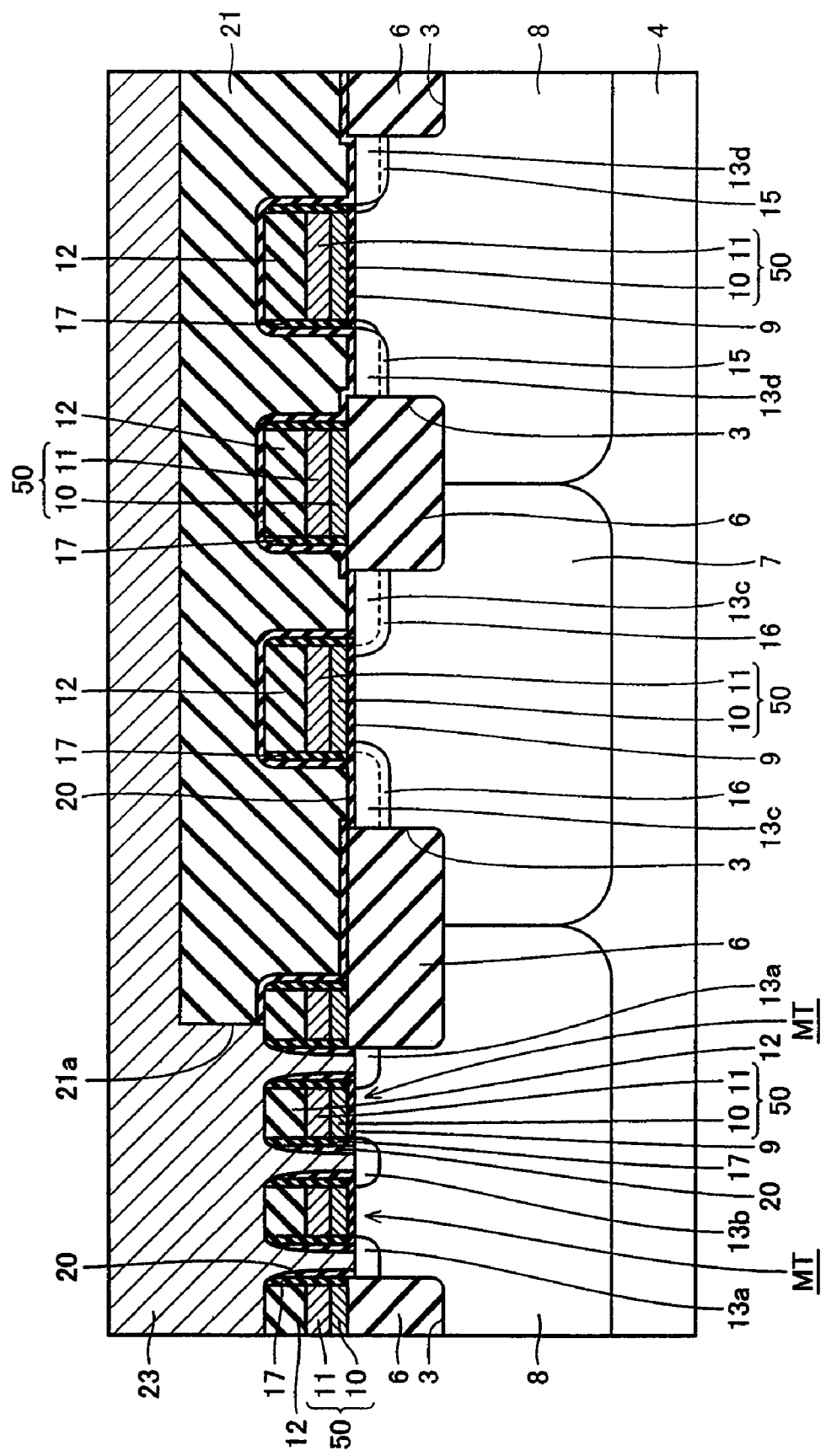

Referring to FIG. 17, an n type doped polysilicon film 23 is deposited by, for example, the CVD method to be embedded in opening 21a and to cover doped TEOS oxide film 21. Thereafter, n type doped polysilicon film 23 is polished by, for example, the CMP using doped TEOS oxide film 21 as a stopper.

Figure 18:
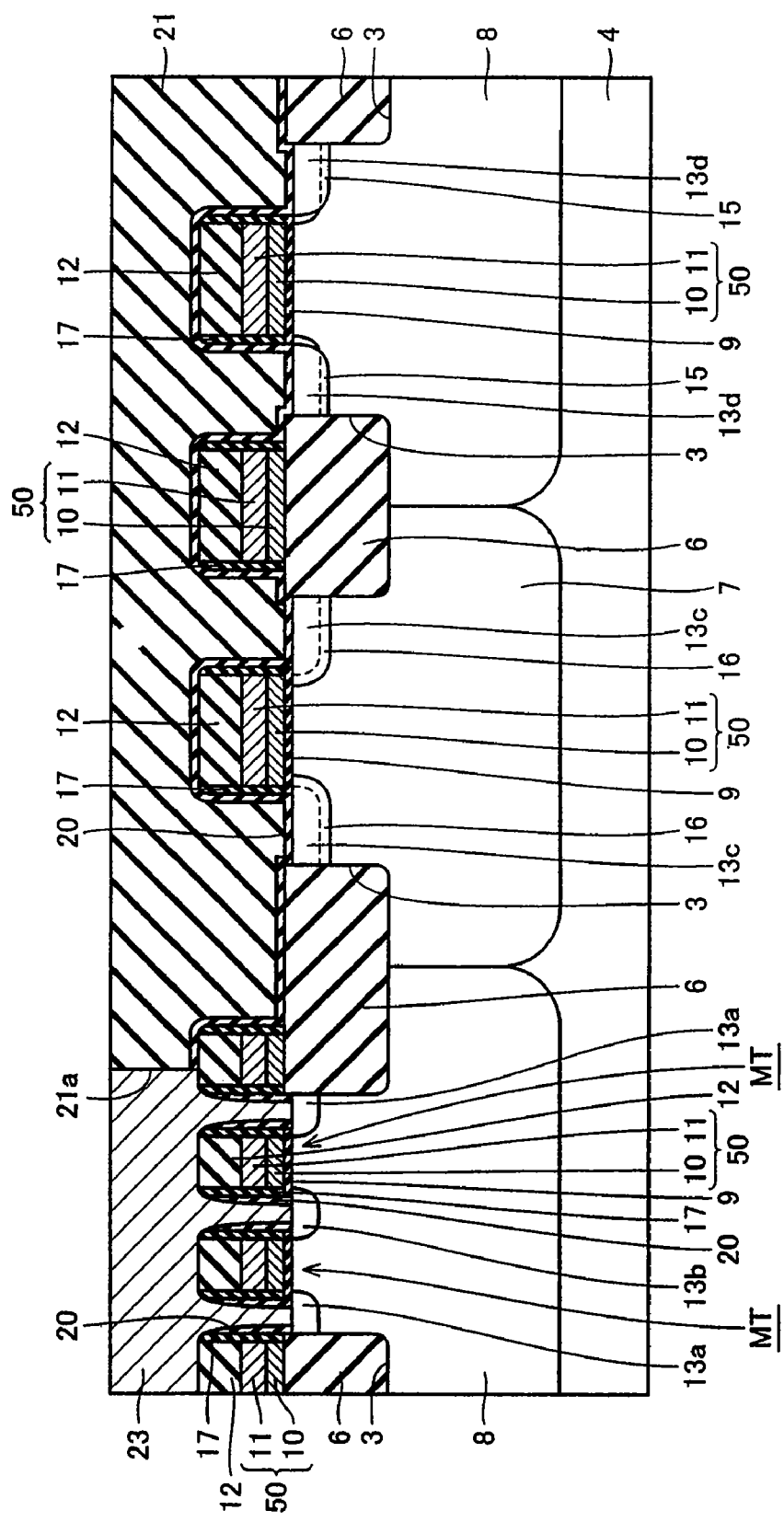

Referring to FIG. 18, by the aforementioned CMP, an upper surface of doped TEOS oxide film 21 is exposed and n type doped polysilicon film 23 remains only within opening 21a. Thereafter, n type doped polysilicon film 23, doped TEOS oxide film 21 and etching resistance film 20 are polished by, for example, the CMP using cap film 12 as a stopper.

Figure 19:
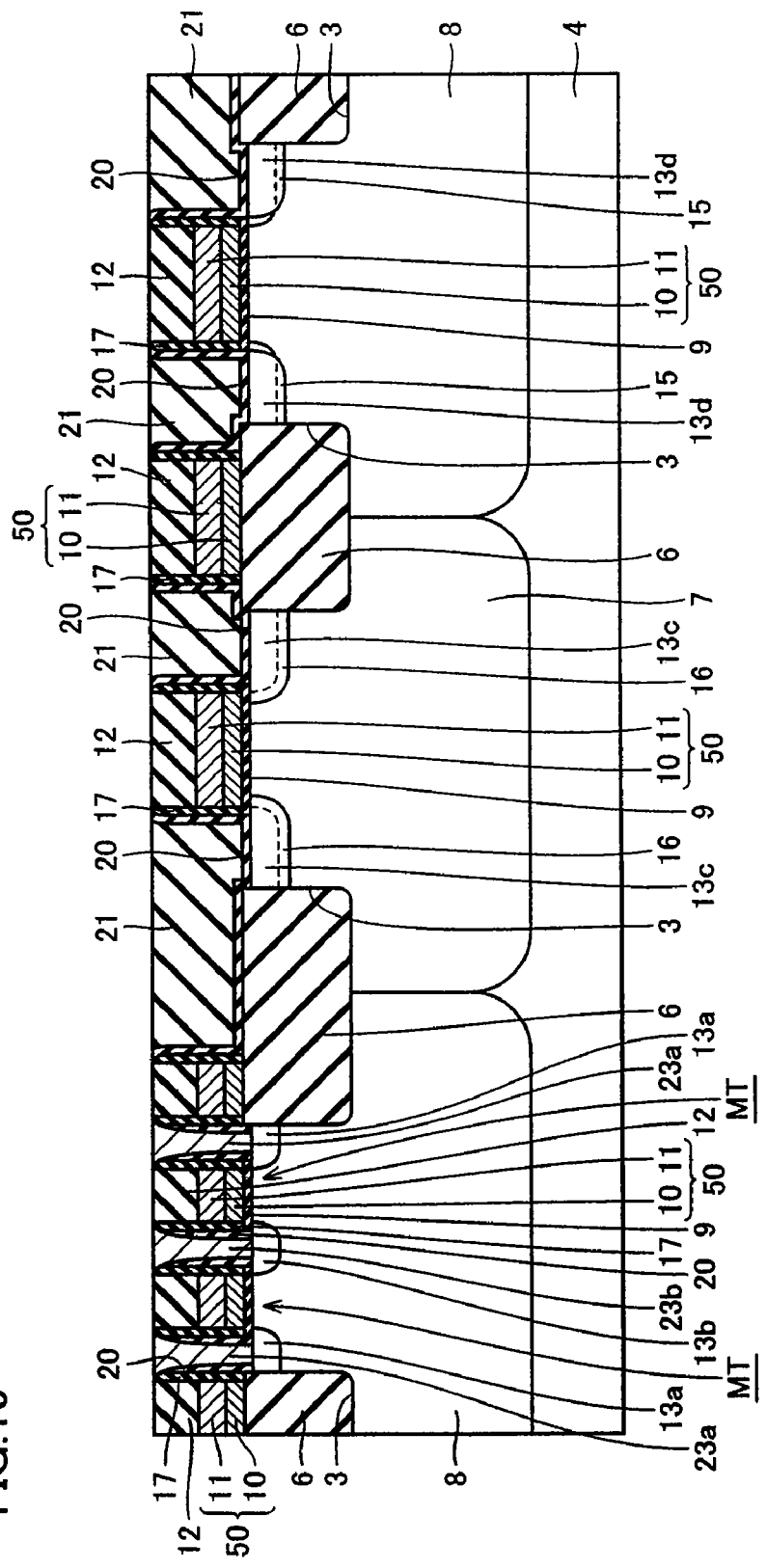

Referring to FIG. 19, by the aforementioned CMP, an upper surface of cap film 12 is exposed and n type doped polysilicon film 23 remains between gate electrode layers 50 in the memory cell array. As a result, plug conductive layer 23a embedded in the storage node contact and plug conductive layer 23b embedded in the bit line contact are formed from n type doped polysilicon film 23. In addition, the upper surface of cap film 12, the upper surface of doped TEOS oxide film 21, and each of upper surfaces of plug conductive layers 23a, 23b form substantially an identical plane.

Figure 20:
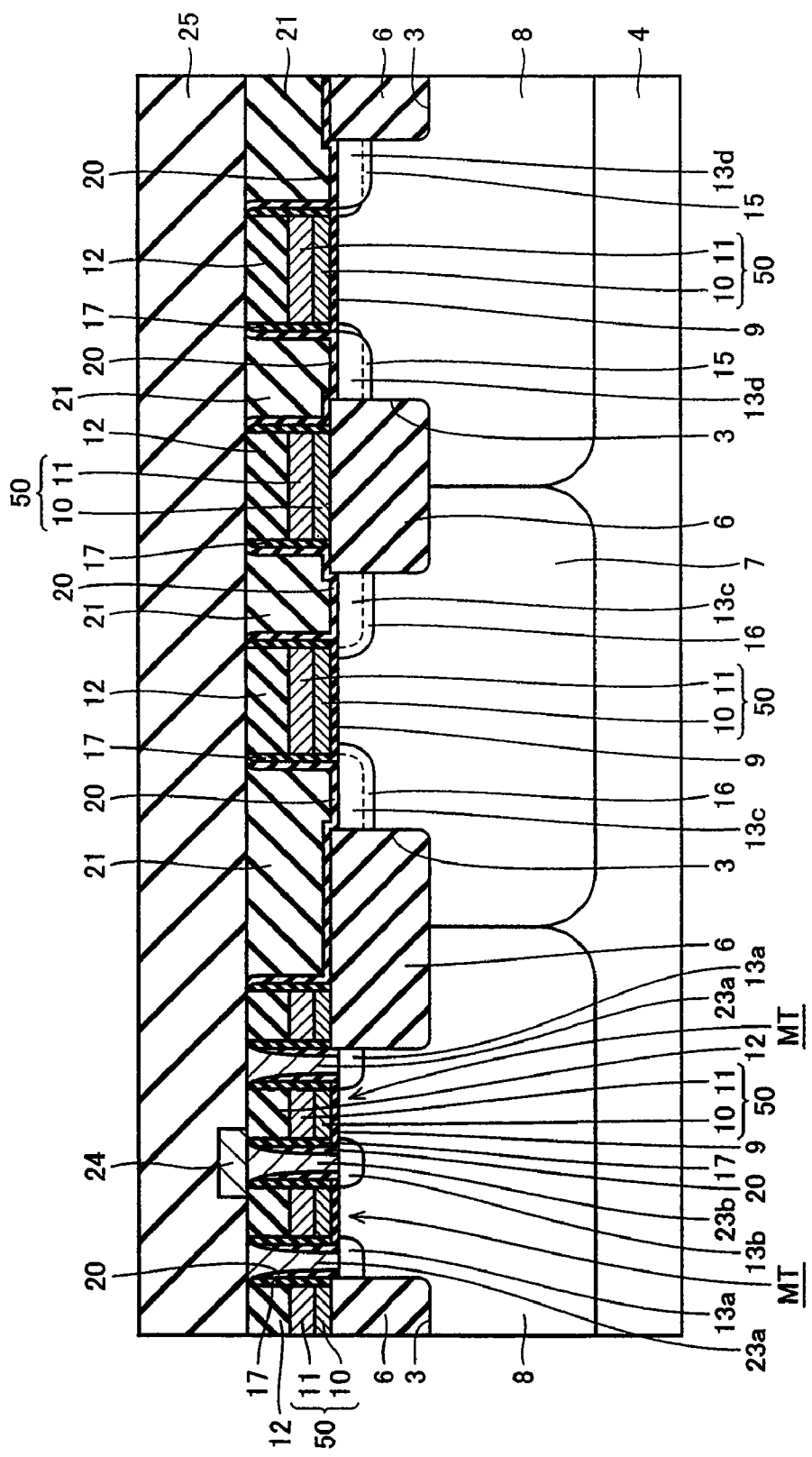

Referring to FIG. 20, bit line 24 is formed to contact with plug conductive layer 23b using the photolithographic technique and the etching technique. Interlayer insulation film 25 formed with, for example, a silicon oxide film is formed to cover the bit line and the like.

Figure 21:
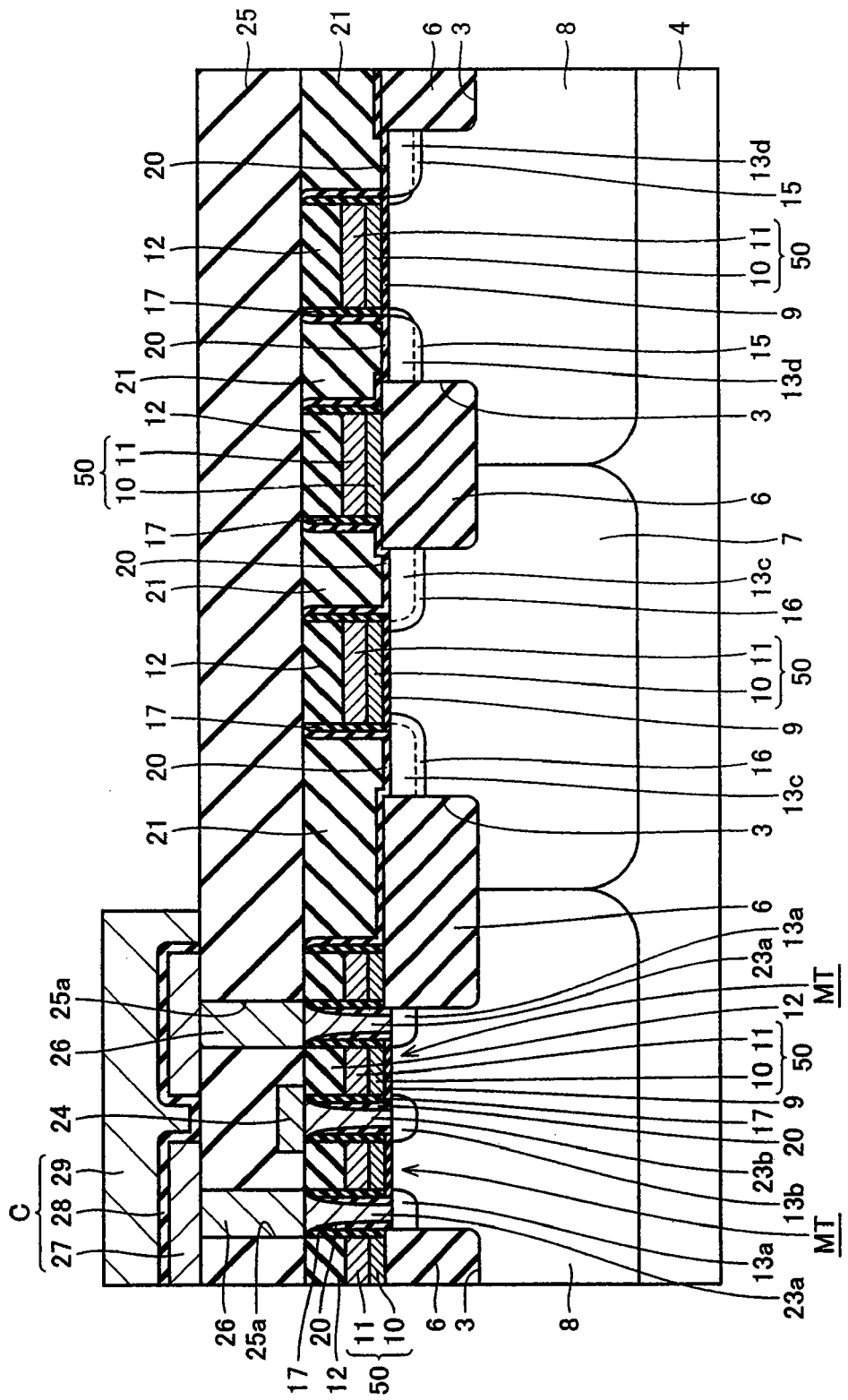

Referring to FIG. 21, hole 25a is formed in interlayer insulation film 25 using the photolithographic technique and the etching technique, and then embedded conductive layer 26 is formed to be embedded in hole 25a. Storage node 27 is formed on interlayer insulation film 25 to be electrically connected to the source/drain region via embedded conductive layer 26 and plug conductive layer 23a. Capacitor dielectric film 28 is formed to cover the storage node, and cell plate 29 is formed opposed to storage node 27 with capacitor dielectric film 28 interposed therebetween. As a result, capacitor C formed with storage node 27, capacitor dielectric film 28 and cell plate 29 is constructed.

With these steps, the memory cell having a self-aligned contact structure and a peripheral circuit are formed.

According to this embodiment, the active region (field) extends in an oblique direction to the extending direction of word line (gate electrode layer) 50. Therefore, a larger pitch between the active regions can be ensured as compared with the active region extending perpendicular to word line (gate electrode layer) 50.

Figure 24:
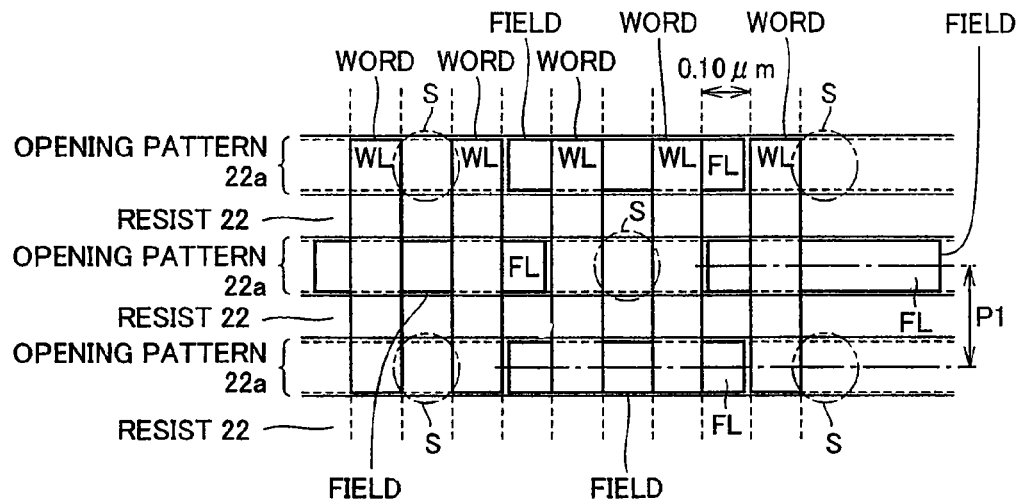
FIG. 24 is a diagram for explaining a pitch of active regions when each active region is perpendicular to a word line.
Figure 25:
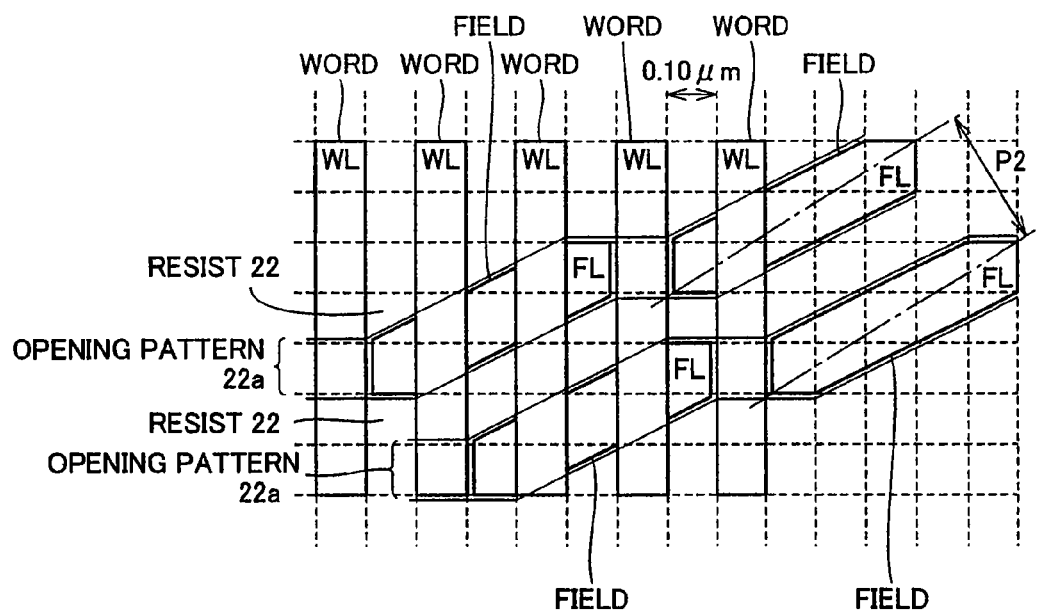
FIG. 25 is a diagram for explaining a pitch of active regions when each active region is oblique to a word line.

As shown in FIG. 24, when the active region is perpendicular to the word line, a pitch P1 of the active regions is 0.2 μm under design rules having a spacing of 0.10 μm between the word lines. On the other hand, when the active region is oblique to the word line as shown in FIG. 25, pitch P1 of the active regions is about 0.28 μM under the design rules having a spacing of 0.10 μm between the word lines. Therefore, when the active region is oblique to the word line, the pitch between the active regions can be 1.4 times that in the perpendicular situation.

As a result, when a band-shaped opening pattern is used to form the storage node contact and the bit line contact in each of the patterns shown in FIGS. 24 and 25, a pitch of the band-shaped opening patterns when the active region is oblique to the word line can also be 1.4 times that in the perpendicular situation. Therefore, a margin of the photolithographic process largely increases and the photolithographic process with light of a long wavelength is allowed, resulting in easy cost reduction.

More specifically, as the margin of the photolithographic process largely increases, patterning which could not be performed with ArF with design rules of 90 nm becomes possible even with KrF. That is, band-shaped opening pattern 22a of this embodiment is characterized in that it is equivalent to design rules of a previous generation. This has not only an effect of increasing the process margin, but also an effect of cost reduction because a KrF process, which requires lower cost than an ArF process does, can be used.

In addition, if band-shaped opening pattern 22a is to be used in the plane pattern shown in FIG. 24, a conductive layer which is not electrically connected to any conductive region will be undesirably formed in a region S between the active regions together with other plug conductive layers when opening patterns above the active regions are linked to form a continuous band-shaped opening pattern. With such additive conductive layer formed in region S, other conductive layers may be short-circuited with each other. Therefore, band-shaped opening pattern 22a must be provided with a blank (that is, a region which is not opened) in region S.

In contrast, the blank as described above is not required to use band-shaped opening pattern 22a in the plane pattern shown in FIG. 25, and continuous band-shaped opening pattern 22a can be formed by linking opening patterns above the active regions.

In addition, since the upper surface of cap film (hard mask layer) 12 and the upper surface of each of plug conductive layers 23a, 23b form substantially an identical plane, there is no difference in level between the upper surfaces. As a result, an upper surface of a layer formed above cap film 12 and plug conductive layers 23a, 23b can easily be planarized so that patterning or the like of the layer with the photolithographic process or the like can easily be performed. Thus, a process margin of a subsequent process can be ensured.

Furthermore, since the bit line contact and the storage node contact can be opened using band-shaped opening pattern 22a (FIGS. 14 and 23), a microloading effect of etching is decreased as compared with a conventional method of opening a hole pattern, and a process with low "aperture defect" can be provided.

In addition, since the bit line contact and the storage node contact can be opened using band-shaped opening pattern 22a (FIGS. 14 and 23), besides the decrease in the microloading effect of etching is allowed, a selection ratio of a nitride film and an oxide film can also be improved substantially, and thus a process tolerance of an electrical "short" of the gate electrode and the polysilicon film can be ensured.

Furthermore, since band-shaped opening pattern 22a is a non-linear pattern as shown in FIG. 23, a stable transferring process resistant to falling of photoresist pattern 22 can be provided.

Second Embodiment

Figure 26:
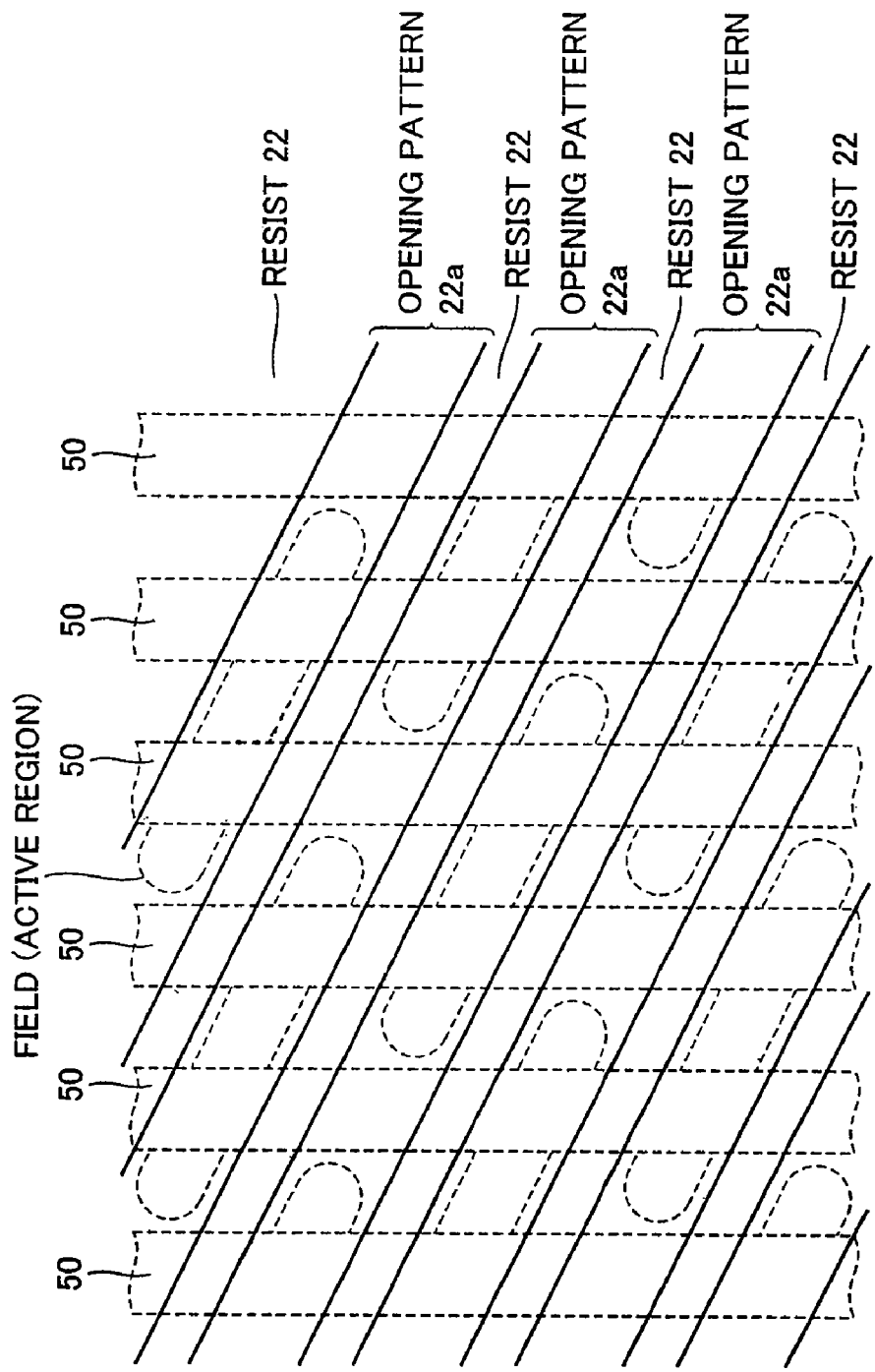
FIG. 26 is a schematic plan view of a step of a manufacturing method of a semiconductor device according to a second embodiment of the present invention, showing a portion of a memory cell array of a DRAM.
Figure 27:
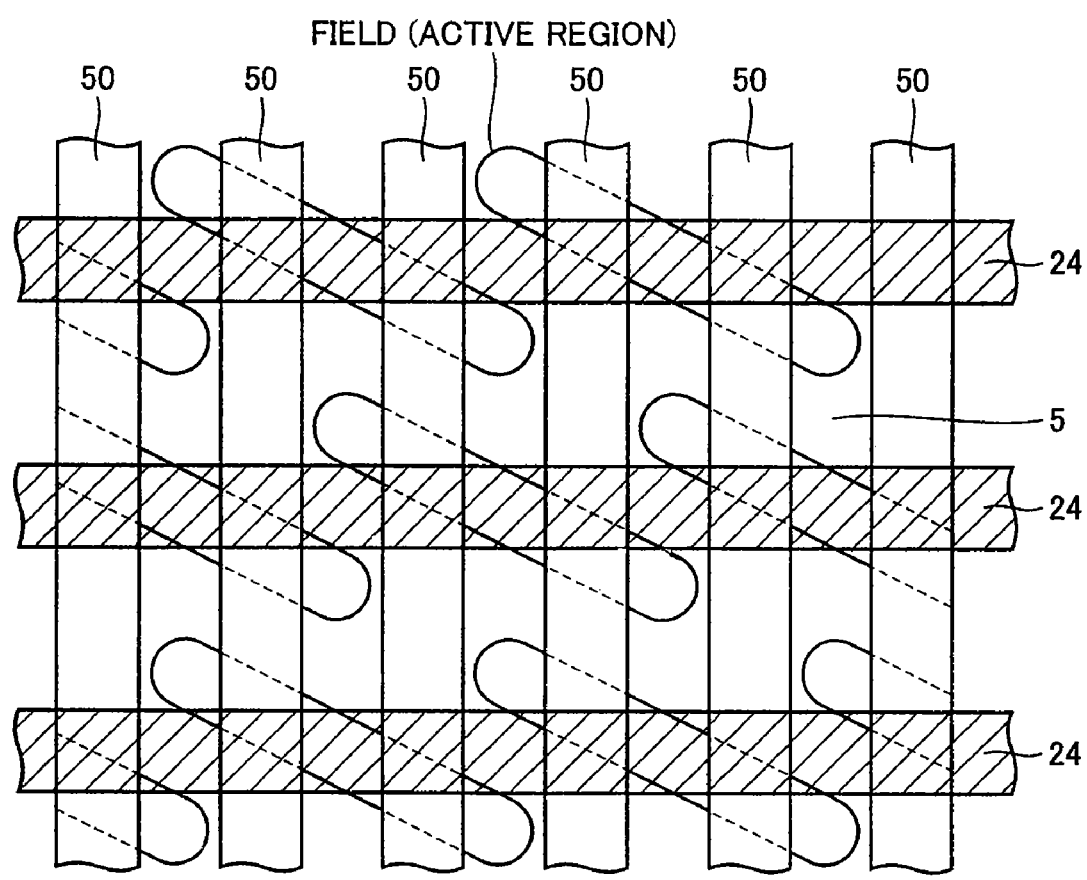
FIG. 27 is a schematic plan view of a construction of the semiconductor device according to the second embodiment of the present invention, showing a portion of the memory cell array of the DRAM.

Though band-shaped opening pattern 22a in the first embodiment is non-linear and has uneven width, opening pattern 22a having a uniform width may be formed. As opening pattern 22a with a uniform width, a linear band-shaped opening pattern 22a as shown in a plan view of FIG. 26 may be formed. As a result, a memory cell array of the DRAM having a plane layout as shown in FIG. 27 is formed. The capacitor is not shown in FIG. 27.

As a manufacturing method and a construction of this embodiment are similar to those in the first embodiment except for the aforementioned point, similar elements are indicated by the same reference characters and descriptions thereof will not be repeated here.

Third Embodiment

In the steps shown in FIGS. 17-19 in the first embodiment, planarization is performed by the CMP using cap film (hard mask layer) 12 as a stopper to make the upper surface of each of plug conductive layers 23a, 23b and the upper surface of cap film (hard mask layer) 12 parallel to the surface of silicon substrate 4. Planarization by the CMP, however, may be performed after dry etching is performed following the step of FIG. 17 or 18.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A manufacturing method of a semiconductor device, comprising the steps of:
    forming a stacked pattern of successively stacked gate electrode layer and insulating layer including silicon nitride so as to extend across an active region surrounded with an element isolation structure in a direction not perpendicular to an extending direction of said active region but in an oblique direction;
    forming a pair of impurity diffusion regions on a surface of said active region, said gate electrode layer being located between the impurity diffusion regions;
    forming a silicon nitride film so as to cover a transistor having said gate electrode layer and said pair of impurity diffusion regions,
    forming a silicon oxide film to cover said transistor having said gate electrode layer and said pair of impurity diffusion regions;
    forming a band-shaped opening pattern extended in said extending direction of said active region and having a width greater than said active region in said silicon oxide film in a region above a whole of said active region to expose an upper surface of said silicon nitride film from said opening pattern;
    removing said silicon oxide film of a sidewall of said opening pattern so as to increase a width of said opening pattern,
    exposing each of said pair of impurity diffusion regions by removing said silicon nitride film exposed in said opening pattern,
    embedding a conductive layer in said opening pattern; and
    removing said conductive layer and said silicon oxide film until an upper surface of said insulating layer is exposed to form first and second plug conductive layers each electrically connected to each of said pair of impurity diffusion regions and to make an upper surface of each of said first and second plug conductive layers and an upper surface of said insulating layer form substantially an identical plane.

2. The manufacturing method of a semiconductor device according to claim 1, wherein
    said band-shaped opening pattern has a linear plane pattern.

3. The manufacturing method of a semiconductor device according to claim 1, wherein
    said band-shaped opening pattern has a non-linear plane pattern.

* * * * *